US006630977B1

(12) United States Patent
Yamazaki et al.

(10) Patent No.: US 6,630,977 B1
(45) Date of Patent: Oct. 7, 2003

(54) SEMICONDUCTOR DEVICE WITH CAPACITOR FORMED AROUND CONTACT HOLE

(75) Inventors: Shunpei Yamazaki, Tokyo (JP); Yoshiharu Hirakata, Kanagawa (JP); Satoshi Murakami, Kanagawa (JP)

(73) Assignee: Semiconductor Energy Laboratory Co., Ltd. (JP)

(*) Notice: Subject to any disclaimer, the term of this patent is extended or adjusted under 35 U.S.C. 154(b) by 0 days.

(21) Appl. No.: 09/573,314

(22) Filed: May 18, 2000

(30) Foreign Application Priority Data

May 20, 1999 (JP) ............................. 11-139374

(51) Int. Cl.[7] .......................................... G02F 1/1343
(52) U.S. Cl. ............................ 349/141; 349/38; 349/39
(58) Field of Search .................... 349/141, 155, 349/156, 38, 39

(56) References Cited

U.S. PATENT DOCUMENTS

| 5,463,483 A | 10/1995 | Yamazaki ................. 359/58 |
| 5,485,019 A | 1/1996 | Yamazaki et al. ............ 257/57 |
| 5,576,857 A | 11/1996 | Takemura .................. 359/59 |
| 5,595,638 A | * 1/1997 | Konuma et al. ............. 205/96 |
| 5,643,826 A | 7/1997 | Ohtani et al. ................ 437/88 |
| 5,650,636 A | 7/1997 | Takemura et al. ............ 257/59 |
| 5,712,495 A | 1/1998 | Suzawa ..................... 257/51 |
| 5,729,308 A | 3/1998 | Yamazaki et al. ............ 349/39 |
| 5,757,444 A | 5/1998 | Takemura .................. 349/38 |
| 5,763,899 A | 6/1998 | Yamazaki et al. ............ 257/59 |
| 5,777,713 A | * 7/1998 | Kimura ..................... 349/156 |
| 5,847,687 A | 12/1998 | Hirakata et al. ............. 345/96 |
| 5,849,611 A | 12/1998 | Yamazaki et al. ........... 438/151 |
| 5,852,488 A | 12/1998 | Takemura .................. 349/187 |
| 5,856,689 A | 1/1999 | Suzawa ..................... 257/296 |
| 5,923,962 A | 7/1999 | Ohtani et al. ............... 348/150 |
| 5,929,464 A | 7/1999 | Yamazaki et al. ............ 257/72 |

(List continued on next page.)

FOREIGN PATENT DOCUMENTS

| JP | 6-160878 | 6/1994 |
| JP | 7-130652 | 5/1995 |
| JP | 9-211477 | 8/1997 |
| JP | 9-211495 | 8/1997 |
| JP | 09211495 A | * 8/1997 | ........... G02F/1/136 |
| JP | 10-247735 | 9/1998 |
| JP | 2000122071 A | * 4/2000 | ......... G02F/1/1339 |

OTHER PUBLICATIONS

Shimokawa, R. et al, "Characterization of High–Efficiency Cast–Si Solar Cell Wafers by MBIC Measurement," *Japenese Journal of Applied Physics*, vol. 27, No. 5, pp. 751–758, May 1988.

(List continued on next page.)

Primary Examiner—Robert H. Kim
Assistant Examiner—Andrew Schechter
(74) Attorney, Agent, or Firm—Cook, Alex, McFarron, Manzo, Cummings & Mehler, Ltd.

(57) ABSTRACT

A method of forming a storage capacitor in an IPS liquid crystal display device is proposed, and a technique of forming a pixel region having a high aperture ratio is provided. An anodic oxidation process at an applied voltage/voltage supply time ratio of 11 V/min is performed for insulating films used in each circuit of an electro-optical device, typically an IPS method LCD, in particular for the surface of a common electrode formed on a resin film. The amount of formation of the extra anodic oxide film can be reduced by covering with an anodic oxide film, and a liquid crystal display device with high reliability and having an electrode with superior adhesion can be manufactured.

36 Claims, 19 Drawing Sheets

U.S. PATENT DOCUMENTS

| | | | | |
|---|---|---|---|---|
| 5,959,599 A | | 9/1999 | Hirakata | 345/92 |
| 5,977,562 A | * | 11/1999 | Hirakata et al. | 257/72 |
| 5,995,186 A | * | 11/1999 | Hiroshi | 349/141 |
| 5,998,841 A | | 12/1999 | Suzawa | 257/350 |
| 6,013,930 A | | 1/2000 | Yamazaki et al. | 257/353 |
| 6,100,947 A | * | 8/2000 | Katayama | 349/38 |
| 6,165,824 A | | 12/2000 | Takano et al. | |
| 6,344,884 B1 | * | 2/2002 | Kim et al. | 349/43 |

OTHER PUBLICATIONS

English abstract re Japanese patent application No. 6-160878, published Jun. 7, 1994.

English abstract re Japanese patent application No. 7-130652, published May 19, 1995.

English abstract re Japanese patent application No. 9-211477, published Aug. 15, 1997.

English abstract re Japanese patent application No. 9-211495, published Aug. 15, 1997.

English abstract re Japanese patent application No. 10-247735, published Sep. 14, 1998.

* cited by examiner

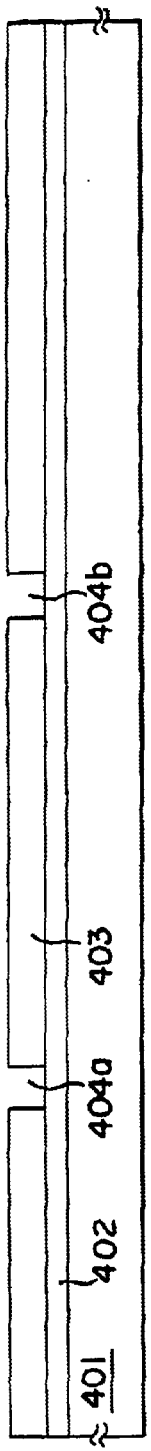
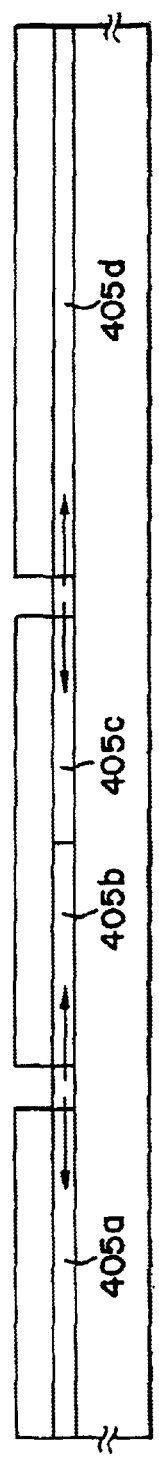
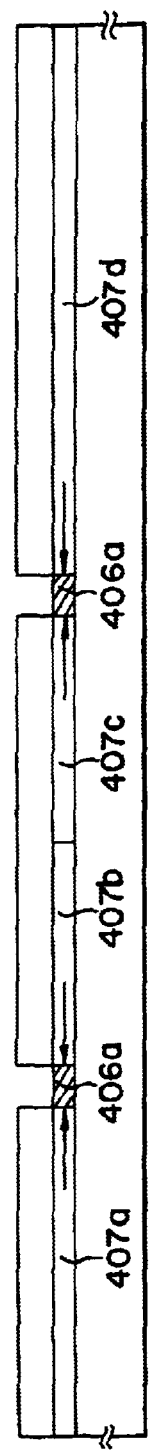
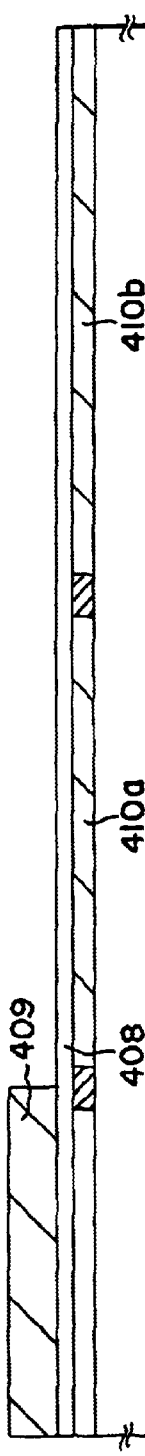
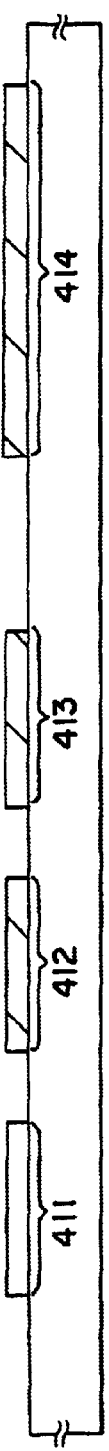

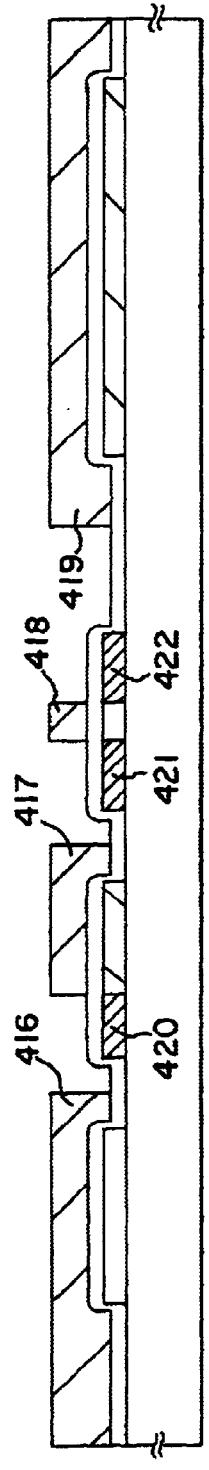
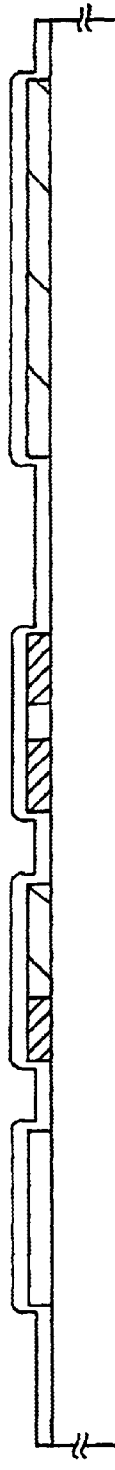
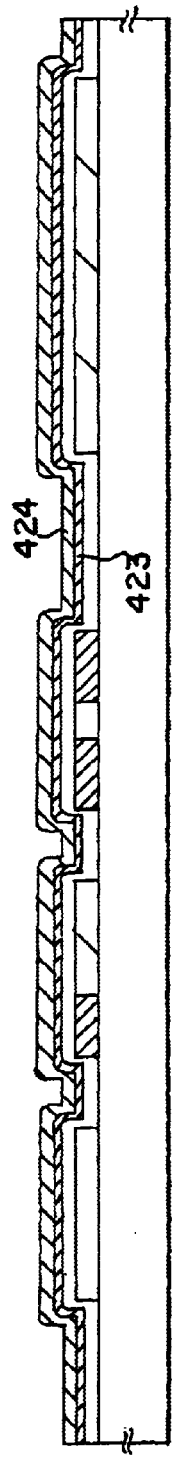
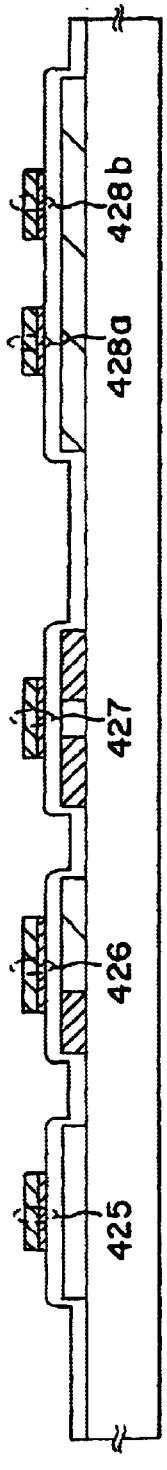
FIG.5A
FIG.5B
FIG.5C
FIG.5D
FIG.5E

SEMICONDUCTOR DEVICE WITH CAPACITOR FORMED AROUND CONTACT HOLE

BACKGROUND OF THE INVENTION

1. Field of the Invention

The present invention relates to a semiconductor device having a circuit composed of a thin film transistor (hereafter referred to as TFT), and to a method of manufacturing thereof. For example, the present invention relates to an electro-optical device, typically a liquid crystal display panel, and to electronic equipment loaded with that kind of electro-optical device as a part.

Note that, throughout this specification, the term semiconductor device specifies devices in general which function by utilizing semiconductor characteristics, and that electro-optical devices, semiconductor circuits, and electronic equipment are all semiconductor devices.

2. Description of the Related Art

Techniques of forming thin film transistors (TFTs) using a semiconductor thin film (with a thickness on the order of several tens to several hundreds of nanometers) formed on a substrate having an insulating surface have been in the spotlight in recent years. Thin film transistors are widely applied in electronic devices such as an IC or an electro-optical device, and in particular, their development as a switching element of a pixel display device has been accelerating.

For example, a liquid crystal display device is a device in which a TFT is placed in each of several million pixels laid out in a matrix shape, and by controlling the electric charge applied to each pixel electrode by the switching function of the TFTs, the electro-optical characteristics of a liquid crystal is changed, and image display is performed by controlling the light transmitted through a liquid crystal panel.

An IPS method (recorded in Japanese Patent Application Laid-open No. Hei 6-160878) of controlling an electric field in the horizontal direction, with respect to a substrate, in a parallel electrode structure, is known as a method of driving this type of liquid crystal display device.

A liquid crystal display device driven by this IPS method can be driven at a low voltage, and compared to other driving methods (such as a TN method or a STN method), the IPS method has a characteristic of a larger viewing angle.

Further, an IPS liquid crystal display device has a TFT, a gate line, a source line, a pixel electrode, a common line, and a common electrode, extending from the common line in a pixel region, on the same substrate. In order that the electric field applied to a pixel electrode does not impart any influence on another pixel, each pixel electrode is structured as sandwiched by the common electrode arranged in parallel to the pixel electrode. The electrode surface area necessary for these electrodes therefore reduces the aperture ratio of the IPS liquid crystal display device.

Furthermore, in order to ensure the electric charge retention time in a general liquid crystal display device, it is necessary to form a storage capacitor. A sufficient electrode surface area is necessary in order to form a storage capacitor also in the IPS liquid crystal display device, and therefore the aperture ratio is reduced.

In addition, if the wirings and the electrodes are made minuter in order to increase the aperture ratio, then it becomes difficult to ensure a sufficient storage capacitance.

SUMMARY OF THE INVENTION

An object of the present invention disclosed in this specification is to provide a technique for solving the conventional problems stated above. Namely, an object of the present invention is to provide a proposal of a method of forming a storage capacitor in an IPS liquid crystal display device, and to provide a technique of forming a pixel region having a high aperture ratio.

A structure of the present invention disclosed in this specification is a semiconductor device having a pair of substrates and a liquid crystal layer sandwiched by the pair of substrates, characterized in that:

a pixel electrode is formed on one substrate out of the pair of substrates;

an electric field parallel to the face of the substrates is applied between the pixel electrode and a common electrode; and a capacitor is formed by the common electrode, an anodic oxide film of at least a portion of the common electrode, and the pixel electrode formed on the anodic oxide film.

Further, the above structure is characterized in that the common electrode is made from a material which can be anodically oxidized.

Another structure of the present invention is a semiconductor device having a pair of substrates and a liquid crystal layer sandwiched by the pair of substrates, characterized in that:

a pixel electrode is formed on one substrate out of the pair of substrates:

an electric field parallel to the face of the substrates is applied between the pixel electrode and a common electrode;

a capacitor is formed by the common electrode, an anodic oxide film of at least a portion of the common electrode, and the pixel electrode formed on the anodic oxide film; and the liquid crystal layer is surrounded by a sealing material, and spacers are formed in the region in which the sealing material is formed.

Further, another structure of the present invention is a semiconductor device having a pair of substrates and a liquid crystal layer sandwiched by the pair of substrates, characterized in that:

a pixel electrode is formed on one substrate out of the pair of substrates;

an electric field parallel to the face of the substrates is applied between the pixel electrode and a common electrode;

a capacitor is formed by the common electrode, an oxide film of at least a portion of the common electrode, and the pixel electrode formed on the oxide film;

a spacer is formed in a region between a pixel portion, in which the pixel electrode is formed, and a driver circuit; and a spacer is formed in a region in which an element of the driver circuit does not exist.

Further, another structure of the present invention is a semiconductor device having a pair of substrates and a liquid crystal layer sandwiched by the pair of substrates, characterized in that:

a pixel electrode is formed on one substrate out of the pair of substrates;

an electric field parallel to the face of the substrates is applied between the pixel electrode and a common electrode;

a capacitor is formed by the common electrode, an anodic oxide film of at least a portion of the common electrode, and the pixel electrode formed on the anodic oxide film; and a spacer exists on a contact portion of the pixel electrode.

Furthermore, the above structures are characterized in that the oxide film is formed through an anodic oxidation process in which the applied voltage/voltage supply time ratio is equal to or greater than 11 V/min.

In order to realize the above structures, a structure of the present invention is a method of manufacturing a semiconductor device, having the steps of:

forming a resin film on a TFT;

forming a common electrode on the resin film;

forming an oxide film of the common electrode; and forming a pixel electrode covering at least a portion of the oxide film, wherein a capacitor is formed by the common electrode, the oxide film of the common electrode, and the pixel electrode.

Further, another structure of the present invention is a method of manufacturing a semiconductor device, having the steps of:

forming a resin film on an upper part of a TFT;

forming an inorganic film on the resin film;

forming a common electrode on the resin film;

forming an oxide film of the common electrode; and forming a pixel electrode covering at least a portion of the oxide film, wherein a capacitor is formed by the common electrode, the oxide film of the common electrode, and the pixel electrode.

In addition, the above structures are characterized in that sputtering is used for the step of forming the inorganic film on the resin film.

Furthermore, the above structures are characterized in that the step of forming the oxide film is an anodic oxidation process in which the applied voltage/voltage supply time ratio is equal to or greater than 11 V/min.

BRIEF DESCRIPTION OF THE DRAWINGS

In the accompanying drawings:

FIGS. 4A to 4E are diagrams showing processes of manufacturing an LCD;

FIGS. 5A to 5E are diagrams showing processes of manufacturing an LCD;

DETAILED DESCRIPTION OF THE PREFERRED EMBODIMENTS

The preferred embodiments of the present invention are explained below.

Figure 1A:
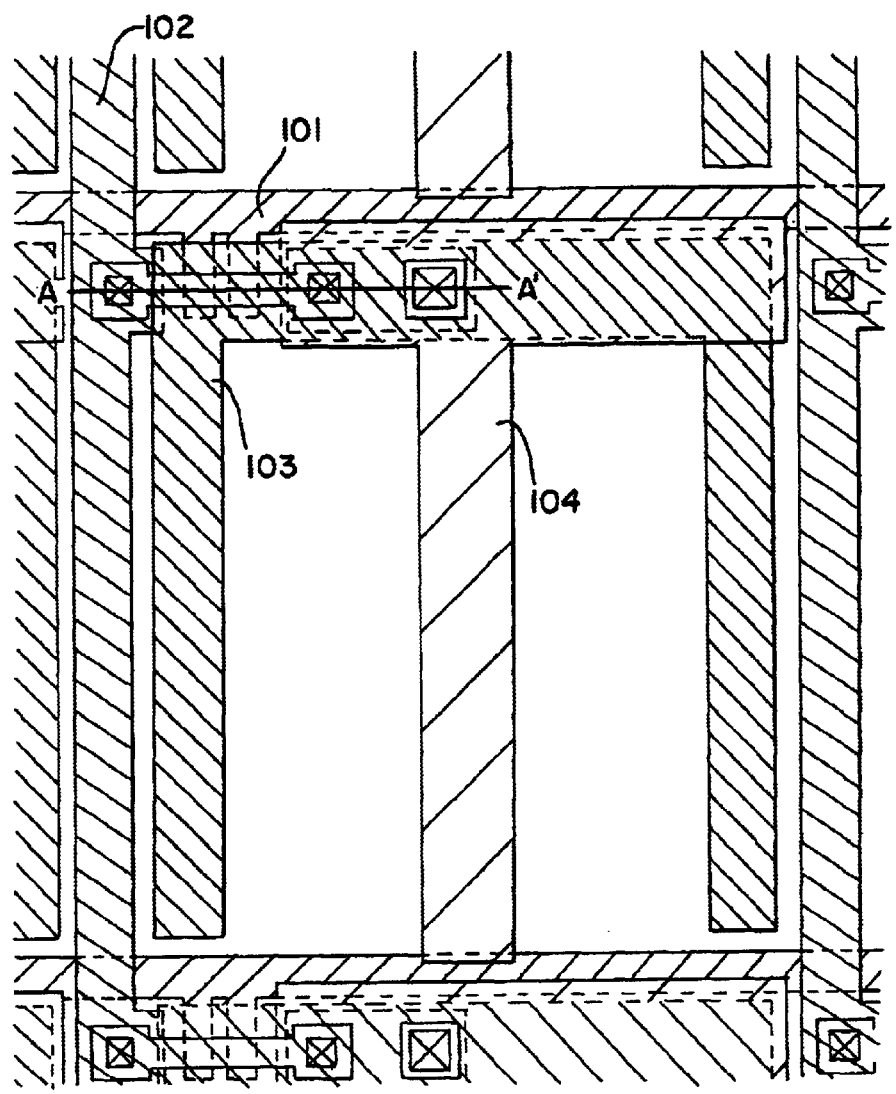
FIGS. 1A and 1B are diagrams showing an example of a top view and a cross-sectional view, respectively, of the pixel portion of the present invention.
Figure 1B:
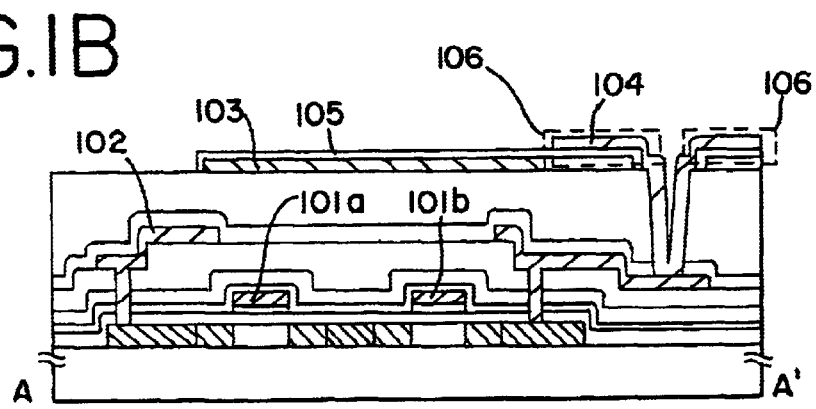

The present invention, as shown in FIGS. 1A and 1B, is characterized in that a first electrode (a common electrode 103) is formed from a material which can be anodically oxidized, an oxide film 105 is formed on the surface of the first electrode, and in addition, a second electrode (a pixel electrode 104) is formed on the oxide film, and a storage capacitor 106 is formed by taking the oxide film formed by anodic oxidation as a dielectric. Further, in FIGS. 1A and 1B, reference numeral 101 denotes a gate wiring, 101a and 101b denote gate electrodes extended from the gate wiring, and 102 denotes a source wiring.

Figure 2:
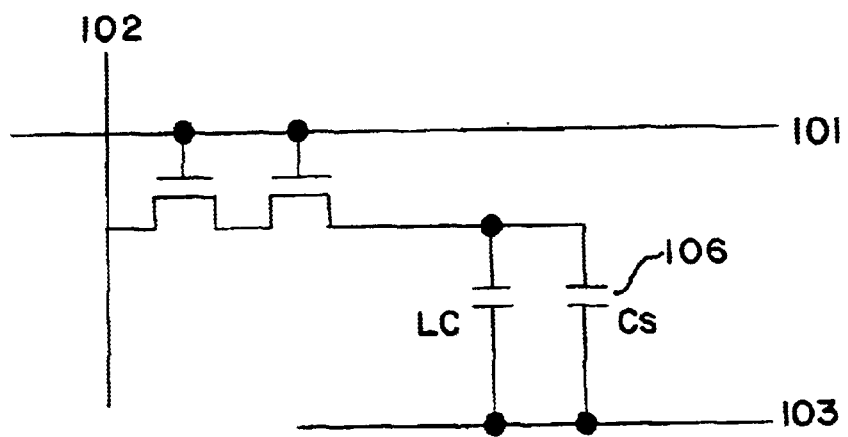
FIG. 2 is an equivalent circuit diagram.

The present invention uses an IPS method of driving a liquid crystal display device by controlling an electric field in the horizontal direction (a direction parallel to a substrate) formed by the first electrode (the common electrode 103) and the second electrode (the pixel electrode 104). Note that FIG. 2 is an equivalent circuit diagram corresponding to FIGS. 1A and 1B.

Valve metal films (for example, ones such as an aluminum film, a tantalum film, a niobium film, a hafnium film, a zirconium film, a chromium film, or a titanium film) and silicon films having conductivity (for example, ones such as a phosphorous doped silicon film or a boron doped silicon film) may be used as the material which can be anodically oxidized that is used in the present invention. In addition, a material having a silicide film, in which the above valve metals are silicified, or a nitrated valve metal film (such as a tantalum nitride film, a tungsten nitride film, or a titanium nitride film) as its principal constituent can be also used. Further, it is possible to use eutectic alloys (such as, for example, a molybdenum tantalum alloy) with other metallic elements (such as tungsten or molybdenum). Furthermore, a laminate film in which these are freely combined may also be used.

A valve metal indicates a barrier type anodic oxidation film which develops anodically, and in which a cathode current flows but an anode current does not flow. In other words, a metal showing a valve-like action. (See *Electro-chemical Handbook*, 4th ed., Electro-chemical Society Proceedings, p. 370, Maruzen, 1985.)

Further, the structure of the first electrode (the common electrode 103), made from the above anodic oxidation capable materials, may be an electrode consists of a single layer film, or may be an electrode consists of a multilayer film. In addition, it is possible to operate the first electrode (the common electrode 103) in FIG. 1A in a floating state (an electrically isolated state), but it may also be set to fixed electric potential, as in the pixel electrode state shown in FIG. 12, preferably to a level at which flicker is not generated, in the neighborhood of the common electric potential (an intermediate electric potential of the image signal sent as data). Furthermore, it may also be combined with a shielding film function which shields against light and electromagnetic waves, as in the electrode state shown in FIG. 13. In addition, an example of the shape of the second electrode (the pixel electrode 104) in the shape of is a "T" is shown in FIG. 1A, but there are no particular limitations to this. For example, the shape of the pixel electrode may be a zigzag shape, as shown in FIG. 14, a "<" shape, as shown in FIG. 15, or the shape shown in FIG. 16.

Note that throughout this specification, an "electrode" is a portion of a "wiring", and indicates a point where the portion of a wiring electrically connects to another wiring, or a point where the portion of a wiring intersects a semiconductor layer. Therefore, for convenience of explanation, while "wiring" and "electrode" are both used, "wiring" is always included in the meaning of "electrode" when "electrode" is used in a phrase.

Further, the anodic oxidation method of the present invention uses a method which differs from a conventional method (a method of moving from a state of constant current flow to a state of constant voltage for the current flowing between, and the voltage between, a cathode and an anode immersed in an anodic oxidation solution). In the conventional method, a material which can be anodically oxidized and a material film with poor adhesion, for example, an organic resin film, are taken as a base, and an electrode is formed on top thereof. When anodic oxidation is performed to the electrode, non-uniform anodic oxidation is inevitable at the edges of the electrode, and film peeling is occurred due to formation of an extra anodic oxide film.

Compared to the conventional method, the amount of electric current per unit area of the electrode to which anodic oxidation is performed, and the value of the applied voltage per unit time are set to larger values for the anodic oxidation process of the present invention, and if the process is stopped at the stage when the target voltage is reached, the amount of formation of the extra anodic oxide film can be made smaller. In addition, in order to reduce the amount of time required for the anodic oxidation process, the anodic oxide film is formed with the time at the constant voltage state set from several seconds to several minutes, or with the time at the constant voltage state set to zero.

Figure 3:
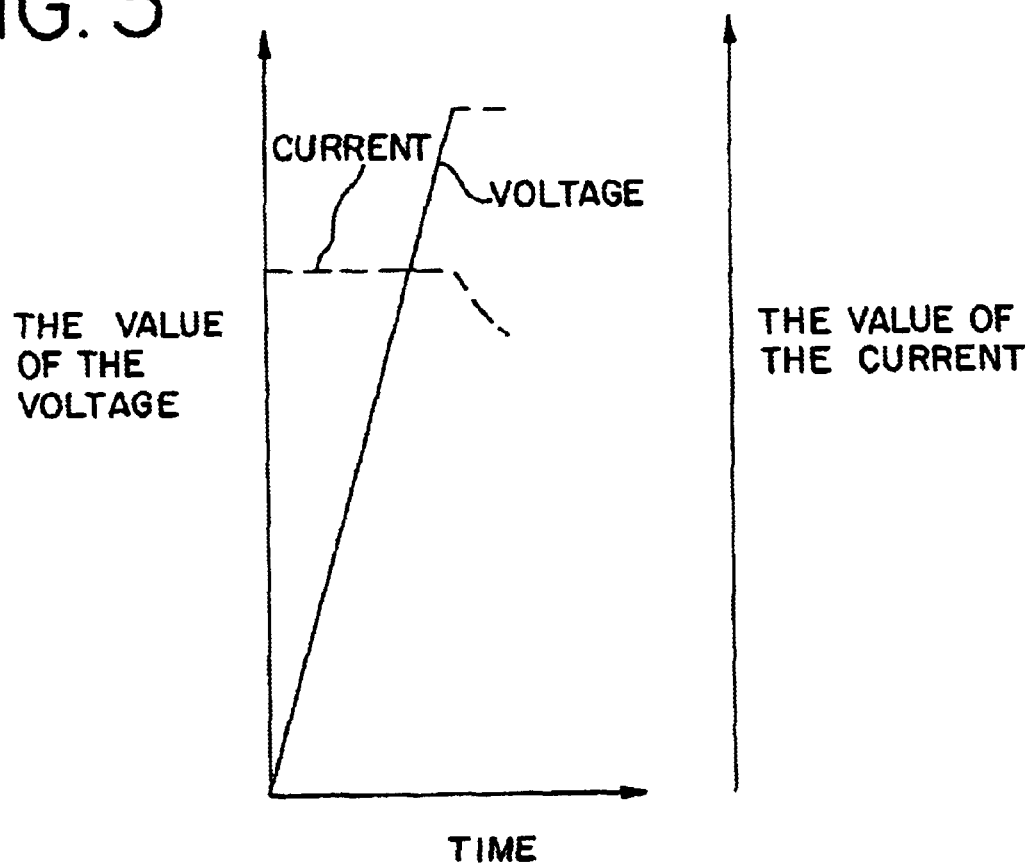
FIG. 3 is a diagram showing the relationship between the voltage between electrodes and the current flow in an anodic oxidation method.
Figure 6A:
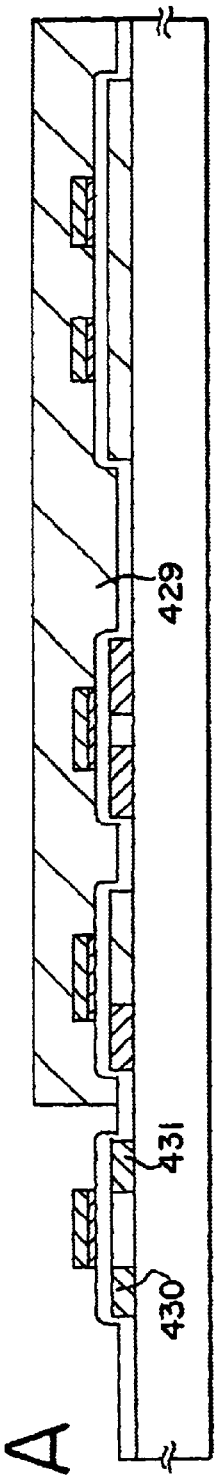
FIGS. 6A to 6D are diagrams showing processes of manufacturing an LCD.
Figure 6B:
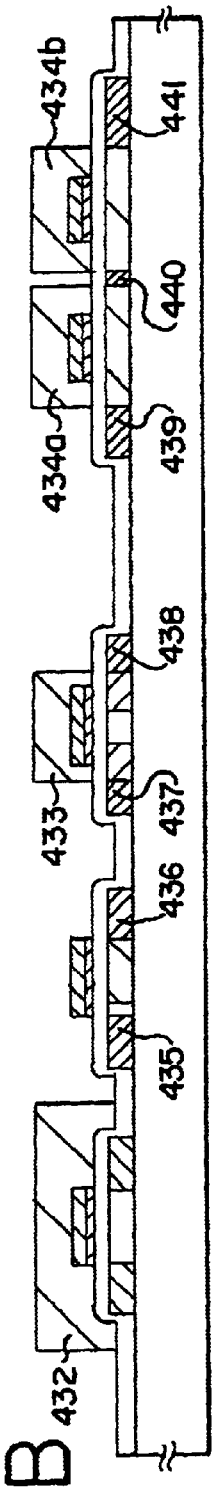
Figure 6C:
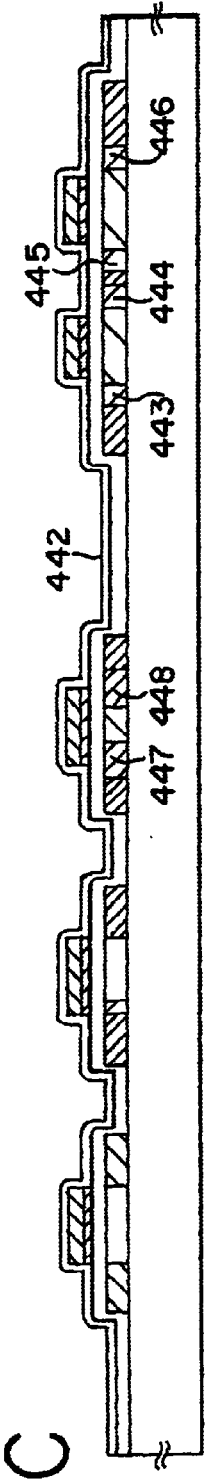
Figure 6D:
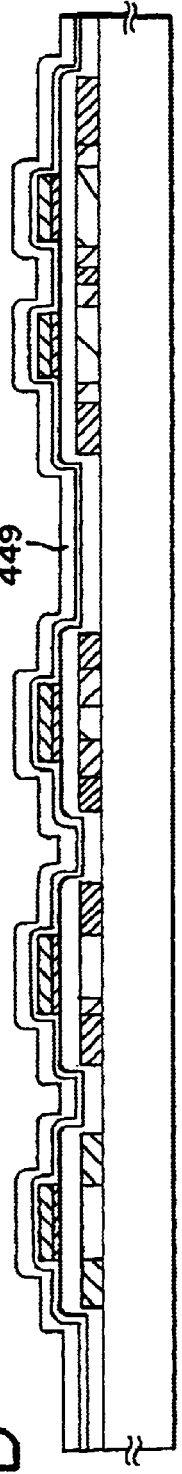
Figure 7A:
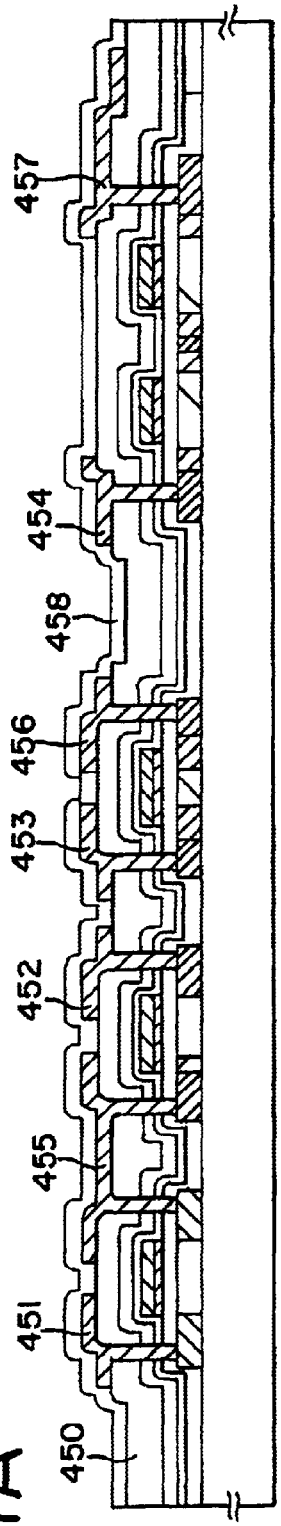
FIGS. 7A and 7B are diagrams showing processes of manufacturing an LCD.
Figure 7B:
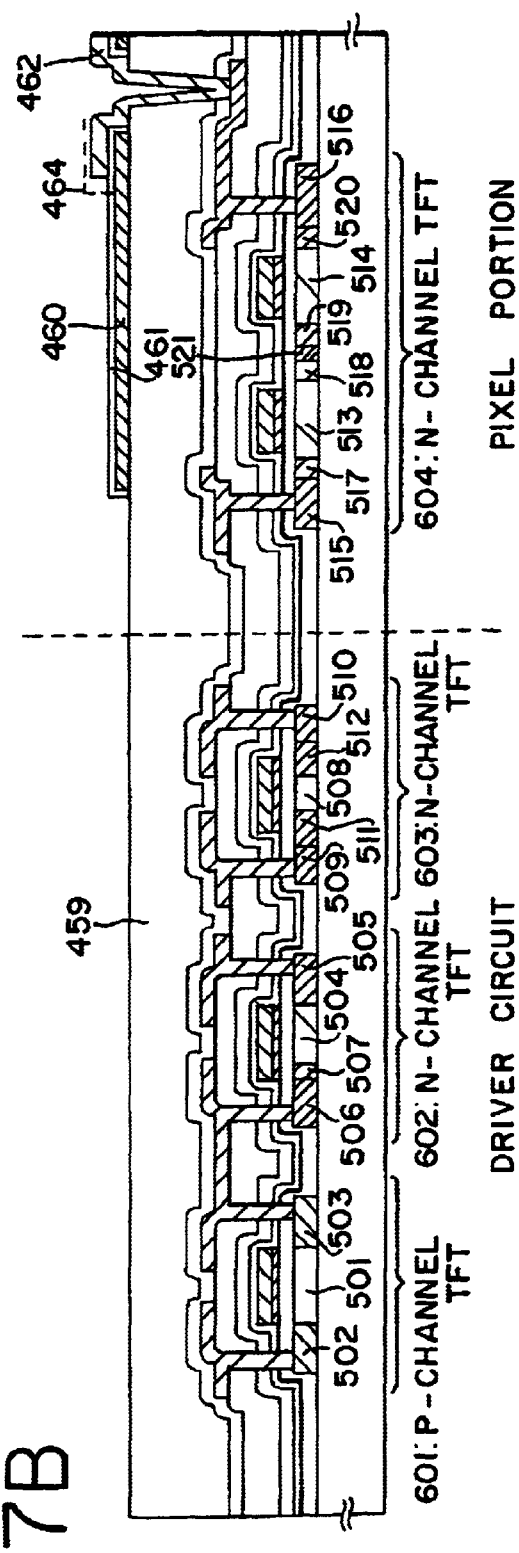

An example of the formation method of the present invention is explained below using FIG. 3. Note that the voltage naturally becomes zero at the stage when the anodic oxidation process is completed, but that this is not shown in FIG. 3.

Specifically, it is preferable that the current density (the amount of current per unit area) of the electrode during anodic oxidation is between 1 and 20 mA/cm$^2$. Note that this is a large current density compared to the current density of the convention process (on the order of approximately 0.3 mA/cm$^2$).

Further, the voltage rate of increase (the value of the voltage increase per unit time) is set to 11 V/min or greater, preferably 100 V/min or greater. This is similarly large compared to the voltage rate of increase of the conventional process (on the order of approximately 10 V/min).

Figure 8:
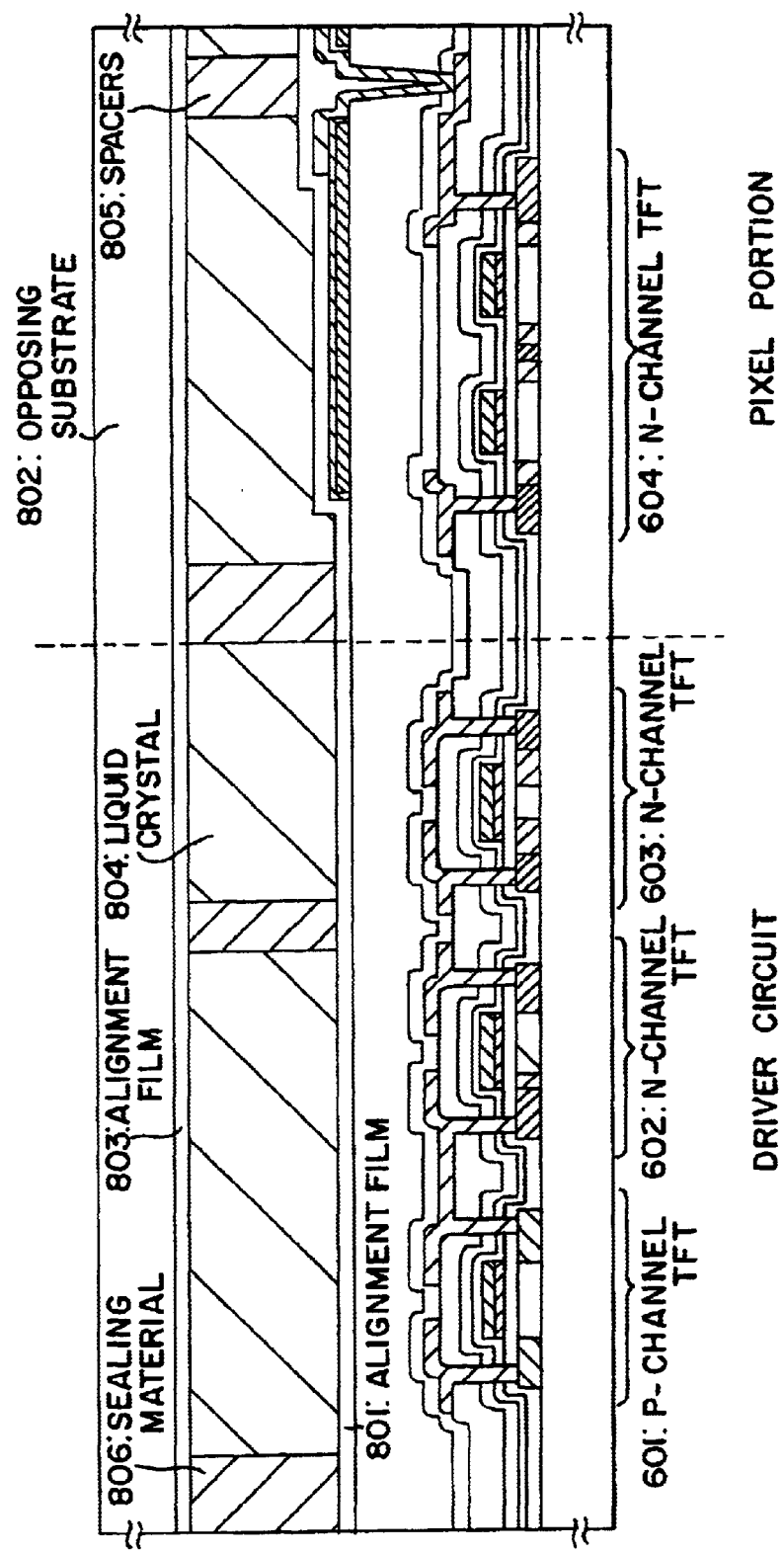
FIG. 8 is a cross sectional structure diagram of a liquid crystal display device.

A cross-sectional diagram of an LCD with an anodic oxide film, formed by using the above stated technique of the present invention, as a dielectric of a storage capacitor placed in a pixel portion is shown in FIG. 8. Note that a CMOS circuit is shown here as a basic circuit structuring a driver circuit, and that a double gate structure TFT is shown as the pixel portion. The structure is not limited to a double gate structure, of course, and structures such as a triple gate structure or a single gate structure may also be used. Further, the structure of the TFT is not limited to a top gate structure, and other structures can also be applied, such as a bottom gate structure, for example.

A more detailed explanation of the present invention, with the above structure, is made by using the embodiments shown below.

Embodiment 1

Embodiment 1 of the present invention is explained by using FIGS. 4A to 8. A method of manufacturing a pixel portion and a driver circuit in order to drive the pixel portion at the same time, and on the same substrate, is explained. Note that in order to simplify the explanation, a CMOS circuit, a basic circuit for circuits such as a shift register circuit and a buffer circuit, and an n-channel TFT which forms a sampling circuit, are shown in the figures.

It is preferable to use a quartz substrate or a silicon substrate as a substrate 401 in FIG. 4A. A quartz substrate is used in embodiment 1. In addition, a substrate such as a metallic substrate or a stainless steel substrate on which an insulating film is formed on the surface may also be used. In embodiment 1, a heat resistance capable of withstanding 800° C. or greater is required, and provided that it can fulfill this condition, any substrate may be used.

A semiconductor film 402 containing an amorphous structure is then formed with a thickness of 20 to 100 nm (preferably between 40 and 80 nm) by reduced pressure thermal CVD, plasma CVD, or sputtering on the surface of the substrate 401 on which the TFTs will be formed. Note that an amorphous silicon film having a thickness of 60 nm is formed in embodiment 1. However, because there is a later thermal oxidation process, this film thickness does not become the final film thickness of an active layer of the TFT.

Further, amorphous semiconductor films and microcrystalline semiconductor films exist as semiconductor films containing an amorphous structure, and in addition, compound semiconductor films containing an amorphous structure such as an amorphous silicon germanium film are also included. In addition, it is effective to form the base film and the amorphous silicon film on the substrate in succession, without exposure to the atmosphere. It becomes possible to ensure that contamination on the surface of the substrate does not impart any influence to the amorphous silicon film by doing so, and that dispersion in the characteristics of the manufactured TFTs can be reduced.

Next, a mask film 403 comprising an insulating film including silicon is formed on the amorphous silicon film 402, and open sections 404a and 404b are formed by patterning. The open sections become addition regions in order to add a catalytic element for promoting crystallization during the next crystallization process, (See FIG. 4A.)

Note that a silicon oxide film, a silicon nitride film, and an oxidized silicon nitride film can be used as the insulating film containing silicon. An oxidized silicon nitride film is an insulating film containing silicon, nitrogen, and oxygen at predetermined amounts, and is an insulating film denoted by $SiO_xN_y$. It is possible to manufacture an oxidized silicon nitride film with $SiH_4$, $N_2O$, and $NH_3$ as raw material gasses, and it is good if the concentration of nitrogen contained is greater than or equal to 25 atomic %, and less than 50 atomic %.

Patterning of the mask film 403 is performed, at the same time a marker pattern, which becomes a basis for later patterning, is formed. The amorphous silicon film 402 is etched slightly during etching of the mask film 403, and that difference in steps can be used as a marker pattern when later performing mask alignment.

A semiconductor film containing a crystalline structure is formed next, in accordance with the technique recorded in Japanese Patent Application Laid-open No. Hei 10-247735 (corresponding to U.S. Pat. Ser. No. 09/034,041). The technique recorded in these patents is a means of crystallization using a catalytic element (one or more elements selected from the group consisting of nickel, cobalt, germanium, tin, lead, palladium, iron, and copper) which promotes crystallization, when crystallizing the semiconductor film containing an amorphous structure.

Specifically, heat treatment is performed in a state in which the catalytic element is maintained in the surface of the semiconductor film containing an amorphous structure, and the semiconductor film containing an amorphous structure is changed into a semiconductor film containing a crystalline structure. Note that the technique recorded in embodiment 1 of Japanese Patent Application Laid-open No. Hei 7-130652 may also be used as a means of crystallization. Further, a so-called single crystal semiconductor film and a polycrystalline semiconductor film are included in the term semiconductor film containing a crystalline structure, and the semiconductor film containing a crystalline structure formed by the above methods possesses grain boundaries.

Spin coating is used when forming a layer containing the catalytic element on the mask film in the above methods, but a means of forming a thin film containing the catalytic element by using the gas phase such as sputtering or evaporation may also o be used.

Further, although it depends upon the amount of hydrogen contained in the amorphous silicon film, it is preferable to perform heat treatment at 400 to 500° C. for on the order of 1 hour, performing crystallization after the hydrogen has been sufficiently desorbed. In this case it is preferable to reduce the amount of hydrogen contained to 5 atomic % or less.

For the crystallization process, heat treatment is first performed at 400 to 500° C. for approximately 1 hour, and after hydrogen has been desorbed from within the film, heat treatment is performed at 500 to 650° C. (preferably between 550 and 600° C.) for 6 to 16 hours (preferably between 8 and 14 hours).

Nickel is used as the catalytic element in embodiment 1, and heat treatment is performed at 570° C. for 14 hours. As a result, crystallization proceeds roughly parallel to the substrate (in the direction shown by the arrows) with the open sections 404a and 404b as starting points, forming crystalline semiconductor films (crystalline silicon films in embodiment 1) 405a to 405d, in which the growth directions of the crystals are macroscopically in alignment. (See FIG. 4B.)

A gettering process for removing the nickel used by the crystallization process from the crystalline silicon film is performed next. A process for adding a periodic table group 15 element (phosphorous in embodiment 1) is performed with the mask insulating film 403 in place as a mask, forming phosphorous added regions 406a and 406b containing a phosphorous at the concentration of between $1 \times 10^{19}$ and $1 \times 10^{20}$ atoms/cm$^3$ (hereafter referred to as gettering regions) in the crystalline silicon film exposed by the open sections 404a and 404b. (See FIG. 4C.)

Heat treatment is performed next in a nitrogen atmosphere at between 450 and 650° C. (preferably from 500 to 550° C.) for 4 to 24 hours (preferably between 6 and 12 hours). The nickel in the crystalline silicon film is made to move in the direction of the arrows by this heat treatment process, and is captured in the gettering regions 406a and 406b by a phosphorous gettering effect. In other words, the concentration of nickel contained in crystalline silicon films 407a to 407d can be reduced to below $1 \times 10^{17}$ atoms/cm$^3$, preferably to $1 \times 10^{16}$ atoms/cm$^3$, by removing nickel from the crystalline silicon film.

The mask film 403 is removed next, and a protecting film 408 is formed on the crystalline silicon films 407a to 407d for use when an impurity is later added. An oxidized silicon nitride film or a silicon oxide film having a thickness of 100 to 200 nm (preferably between 130 and 170 nm) may be used for the protecting film 408. The protecting film 408 has meaning for not directly exposing the crystalline silicon film to a plasma when adding an impurity, and for making it possible to have delicate concentration control.

A resist mask 409 is then formed on the protecting film, and an impurity element which imparts p-type conductivity (hereafter referred to as a p-type impurity element) is added through the protecting film 408. A periodic table group 13 element can be used as the p-type impurity element, typically boron or gallium. This process (referred to as a channel doping process) is a process for controlling the threshold voltage of the TFT. Note that boron is added by ion doping process in which diborane ($B_2H_6$) is plasma-excited without separation of mass. Of course, an ion implantation method in which separation of mass is performed may also be used.

Impurity regions 410a and 410b containing a p-type impurity element (boron in embodiment 1) at the concentration of between $1 \times 10^{15}$ and $\times 10^{18}$ atoms/cm$^3$ (typically from $5 \times 10^{16}$ to $5 \times 10^{17}$ atoms/cm$^3$) are formed by this process. Note that an impurity region containing a p-type impurity element in the above concentration range (however, a region not including phosphorous) is defined as a p-type impurity region (b) throughout this specification. (See FIG. 4D.)

The crystalline silicon film is patterned next, after removing the resist mask 409, forming island-shape semiconductor layers (hereafter referred to as active layers) 411 to 414. Note that by selectively adding nickel and then crystallizing, active layers 411 to 414 are formed by a crystalline silicon film having extremely good crystallinity. Specifically, the active layers have a crystal structure in which rod-like or cylindrical shape crystals are lined up having a specific directionality. Further, the nickel is removed or reduced by the gettering action of phosphorous, making the concentration of the catalytic element remaining in the active layers 411 to 414 $1 \times 10^{17}$ atoms/cm$^3$ or less, preferably $1 \times 10^{16}$ atoms/cm$^3$ or less. (See FIG. 4E.)

The active layer 411 of the p-channel TFT is a region in which an impurity element is intentionally not added, and the active layers 412 to 414 of the n-channel TFT become p-type impurity regions (b). The active layers 411 to 414 in this state are defined as being completely intrinsic, or essentially intrinsic, throughout this specification. In other words, regions in which an impurity element is intentionally added at a level which does not damage the operation of the TFT can be considered to be essentially intrinsic regions.

Next, a 10 to 100 thick insulating film containing silicon is formed by plasma CVD or sputtering. A 30 nm thick oxidized silicon nitride film is formed in embodiment 1. This insulating film containing silicon may be a single layer, or a lamination layer with another insulating film containing silicon.

A heat treatment process (thermal oxidation process) is performed next under an oxidizing environment for between 15 minutes and 8 hours (preferably from 30 minutes to 2 hours) at a temperature of 800 to 1150° C. (preferably between 900 and 1000° C.). In embodiment 1, the heat treatment process is performed at 950° C. for 80 minutes in an oxygen environment in which 3% by volume hydrogen chloride has been added. Note that the boron added by the step of FIG. 4D is activated during this thermal oxidation process. (See FIG. 5A.)

Both a dry oxygen environment and a wet oxygen environment may be used as the oxidizing environment, and a dry oxygen environment is suitable for reducing crystal defects in the semiconductor layers. Further, an environment containing a halogen element in an oxygen environment is used in embodiment 1, but thermal oxidation may be performed in a 100% oxygen environment. In addition, it may be performed by a high pressure oxidation method.

During the thermal oxidation process, an oxidation reaction proceeds even in the interface between the insulating film containing silicon and the active layers 411 to 414 thereunder. Considering this, the film thickness of a gate insulating film 415 finally formed is regulated to be from 50 to 200 nm (preferably between 100 and 150 nm) in the present invention. In the thermal oxidation process of embodiment 1, the thickness of 25 nm out of the 60 nm thick active layers are oxidized, and the film thickness of the active layers 411 to 414 becomes 35 nm. Further, a 50 nm thick thermal oxide film is added to the 30 nm thick insulating film containing silicon, and therefore the final film thickness of the gate insulating film 415 becomes 80 nm.

New resist masks 416 to 419 are formed next. An impurity element which imparts n-type conductivity (hereafter referred to as a n-type impurity element) is then added, forming impurity regions 420 to 422 which present n-type conductivity. Note that a periodic table group 15 element can normally used as the n-type impurity element, typically phosphorous or arsenic. (See FIG. 5B.)

The impurity regions 420 to 422 are impurity regions which will later function as LDD regions in the CMOS circuit and in the n-channel TFT of the sampling circuit. Note that the n-type impurity element is contained in the impurity regions formed here at a concentration of $2\times10^{16}$ to $5\times10^{19}$ atoms/cm$^3$ (typically between $5\times10^{17}$ and $5\times10^{18}$ atoms/cm$^3$). An impurity region containing an n-type impurity element in the above concentration range is defined as an n-type impurity region (b) throughout this specification.

Note that phosphorous is added at a concentration of $1\times10^{18}$ atoms/cm$^3$ here by an ion doping process in which phosphine (PH$_3$) is plasma-excited without separation of mass. Of course, an ion implantation method in which separation of mass is performed may also be used. Phosphorous is added to the crystalline silicon film through the gate film 415 in this process.

Heat treatment is performed next at between 600 and 1100° C. (preferably between 700 and 800° C.) in an inert environment, activating the phosphorous added by the step of FIG. 5B. Heat treatment is performed in a nitrogen environment at 800° C. for 1 hour in embodiment 1. (See FIG. 5C.)

It is possible to restore the active layers, and the interface between the active layers and the gate insulting film, which are damaged during the addition of phosphorous, at this time as well. Furnace annealing using an electric furnace is preferable for this activation process, but a light annealing process such as lamp annealing or laser annealing may also be used together with furnace annealing.

The boundary section of the n-type impurity regions (b) 420 to 422, namely the area where the n-type impurity regions (b) join with the intrinsic, or essentially intrinsic, regions (including p-type impurity regions (b), of course) existing in the periphery of the n-type impurity regions (b), are made clear through this process. This means that the LDD regions and the channel forming regions of the later completed TFTs will form extremely good joining sections.

A conductive film which becomes a gate wiring is formed next. Note that the gate wiring may be formed by a single layer conductive film, but when necessary, it is preferable to make it into a laminate film such as a two layer film or a three layer film. In embodiment 1, a laminate film is formed from a first conductive film 423 and a second conductive film 424. (See FIG. 5D.)

An element selected from the group consisting of tantalum (Ta), titanium (Ti), molybdenum (Mo), tungsten (W), chromium (Cr), and silicon (Si), or a conductive film having one of the above elements as its primary constituent, (typically a tantalum nitride film, a tungsten nitride film, or a titanium nitride film), or an alloy film of a combination of the above elements (typically a film such as an Mo—W alloy film, an Mo—Ta alloy film, or a tungsten silicide film) can be used as the first conductive film 423 and the second conductive film 424.

Note that the thickness of the first conductive film 423 may be from 10 to 50 nm (preferably between 20 and 30 nm), and the thickness of the second conductive film 424 may be from 200 to 400 nm (preferably between 250 and 350 nm). A 50 nm thick tantalum nitride (WN) film is used as the first conductive film 423, and a 350 nm thick tungsten film is used as the second conductive film 424 in embodiment 1. Although not shown in the figures, note that it is effective to form a silicon film with a thickness of between 2 and 20 nm under the first conductive film 423. The adhesion of the conductive films formed on top can be increased, and oxidation can be prevented, by doing so.

Furthermore, it is also effective to use a tantalum nitride film as the first conductive film 423 and a tantalum film as the second conductive film 424.

Next, the first conductive film 423 and the second conductive film 424 are etched together, forming gate wirings 425 to 428 with a thickness of 400 nm. Gate wirings 426 and 427, which are formed in the driver circuit, are formed at this point so as to overlap a portion of the n-type impurity regions (b) 420 to 422 through the gate insulating film 415. This overlapped portion later becomes an $L_{ov}$ region. Note that gate wirings 428a and 428b can be seen as two in cross section, but in actuality they are formed in succession from one connected pattern. (See FIG. 5E.)

A resist mask 429 is formed next, and a p-type impurity element (boron in embodiment 1) is added, forming impurity regions 430 and 431 which contain a high concentration of boron. Boron is added at a concentration from $3\times10^{20}$ to $3\times10^{21}$ atoms/cm$^3$ (typically between $5\times10^{20}$ and $1\times10^{21}$ atoms/cm$^3$) by ion doping using diborane (B$_2$H$_6$) in embodiment 1 (of course ion implantation may also be used). Note that an impurity region containing a p-type impurity element in the above concentration range is defined as a p-type impurity region (a) throughout this specification. (See FIG. 6A.)

After next removing the resist mask 429, resist masks 432 to 434 are formed in a shape that covers region which becomes a gate wiring and a p-channel TFT. An n-type impurity element (phosphorous in embodiment 1) is then added, forming impurity regions 435 to 441 containing a high concentration of phosphorous. Ion doping using phosphine (PH$_3$) is also performed here (ion implantation may also be used, of course), and the concentration of phosphorous in these regions is set from $1\times10^{20}$ to $1\times10^{22}$ atoms/cm$^3$ (typically between $2\times10°$ and $5\times10^{21}$ atoms/cm$^3$). (See FIG. 6B.)

Note that an impurity region containing an n-type impurity element in the above concentration range is defined as an n-type impurity region (a) throughout this specification. Furthermore, phosphorous or boron already added by a prior step is contained in the region in which the impurity regions 435 to 441 are formed, but phosphorous is added at a sufficiently high concentration, and therefore it can be considered that no influence is imparted by the phosphorous or boron added by the prior step. Consequently, the impurity regions 435 to 441 may be paraphrased as n-type impurity regions (a) throughout this specification.

The resist masks 432 to 434 are removed next, and a cap film 442 is formed from an insulating film containing silicon. The film thickness may be set to between 25 and 100 nm (preferably from 30 to 50 nm). A silicon nitride film with a thickness of 25 nm is used in embodiment 1. The cap film 442 also function as a protecting film for preventing oxidation of the gate wirings by a later activation process, but if it is formed too thick, then the stress becomes larger and defects such as film peeling develop, and therefore it is preferable that the thickness be set to 100 nm or less.

An n-type impurity element (phosphorous in embodiment 1) is added next in a self-aligning manner, with the gate wirings 425 to 428 as masks. The addition process is regulated so that phosphorous is doped into impurity regions 443 to 446 thus formed at a concentration between one-tenth and one-half, (typically between one-fourth and one-third), of that of the above n-type impurity regions (b). (However, this is a concentration which is 5 to 10 times higher than the concentration of boron doped by the above channel doping process, from $1\times10^{16}$ to $5\times10^{18}$ atoms/cm$^3$, typically between $3\times10^{17}$ and $3\times10^{18}$ atoms/cm$^3$.) An impurity region containing an n-type impurity element in the above concentration range (excluding p-type impurity regions (a), however) is defined as an n-type impurity region (c) throughout this specification. (See FIG. 6C.)

Phosphorous is added through an insulating film (a laminate film of the cap film 442 and the gate insulating film 415) with a film thickness of 105 nm in this step, and cap films formed on the sidewalls of the gate wirings 434a and 434b also function as masks. In other words, an offset region with a length corresponding to the film thickness of the cap film 442 is formed. Note that "offset region" indicates a re-ion formed contacting a channel forming region, which is formed from a semiconductor film having the same composition as the channel forming region, but which is a high resistance region that does not form an inversion layer (channel region) because a gate voltage is not applied. In order to reduce the value of the off-current value, it is important to suppress the overlap of the LDD regions and the gate wirings as much as possible, it is effective to form the offset region for that reason.

Note that for cases when a p-type impurity element is also contained in the channel forming region at a concentration of $1\times10^{15}$ to $1\times10^{18}$ atoms/cm$^3$ as in embodiment 1, the p-type impurity element will naturally be contained in the offset region at the same concentration.

The length of the offset region is actually determined by the film thickness of the cap films formed in the sidewalls of the gate wirings and by a phenomenon in which an impurity wraps around and is added below a mask) during the addition of the impurity element. However, viewed from the standpoint of suppressing overlap of the LDD regions and the gate wirings, it is extremely effective to form the cap film in advance when forming the n-type impurity region (c) as in the present invention.

Note that, with the exception of portions covered by the gate wirings, phosphorous is doped into all of the impurity regions at a concentration of $1\times10^{16}$ to $5\times10^{18}$ atoms/cm$^3$ in this process, but this does not have an influence on the function of each impurity region because of the extremely low concentration. Further, boron is doped into the n-channel impurity regions (b) 443 to 446 at a concentration of $1\times10^{15}$ to $1\times10^{18}$ atoms/cm$^3$ by the previous channel doping process, but phosphorous is doped here at a concentration which is 5 to 10 times that of boron contained in the p-type impurity regions (b), and therefore boron can be considered in this case as well to not have any influence on the function of the n-type impurity regions (b).

However, strictly speaking, in contrast with the phosphorous concentration of between $2\times10^{16}$ and $5\times10^{19}$ atoms/cm$^3$ in portions of the n-type impurity regions (b) 447 and 448 which overlap with the gate wirings, a phosphorous at a concentration of $1\times10^{16}$ to $5\times10^{18}$ atoms/cm$^3$ is added to portions not overlapping with the gate wirings, and phosphorous is contained at a slightly higher concentration.

A first interlayer insulating film 449 is formed next. An insulating film containing silicon, specifically a silicon nitride film, a silicon oxide film, an oxidized silicon nitride film, or a lamination film of a combination of these films, is formed as the first interlayer insulating film 449. The film thickness may be set to between 100 and 400 nm. A 200 nm thick oxidized silicon nitride film (in which the nitrogen concentration is between 25 and 50 atomic %), formed by plasma CVD with SiH$_4$, NO$_2$O, and NH$_3$ as raw material gasses, is used in embodiment 1.

Heat treatment is performed next in order to activate the n-type or p-type impurity elements added at their respective concentrations. This process can be performed by furnace annealing, laser annealing, lamp annealing, or more than one of these used together. When furnace annealing is performed, it may be performed in an inert environment at between 500 and 800° C., preferably between 550 and 600° C. Heat treatment is performed for 4 hours at 600° C. in embodiment 1, activating the impurity elements. (See FIG. 6D.)

Note that the silicon nitride film 442 and the oxidized silicon nitride film 449 cover the gate wiring in a laminated state in embodiment 1, and that activation is performed in that state. Tungsten is used as the wiring material in embodiment 1, and it is known that tungsten is extremely weak in terms of oxidizing. In other words, even if oxidation is performed with the tungsten film covered by the protecting film when pinholes exist in the protecting film, then the tungsten film is immediately oxidized. An extremely effective silicon nitride film is used as an oxidation preventing film in embodiment 1, however, and an oxidized silicon nitride film is laminated on the silicon nitride film. It is possible, therefore, to perform activation process at a high temperature without worrying about the problem of pinholes in the silicon nitride film.

Heat treatment is performed next, after the activation process, at 300 to 450° C., for between 1 and 4 hours, in a 3 to 100% hydrogen environment, and hydrogenation of active layers is performed. This process is one of terminating dangling bonds in the semiconductor layers by thermally excited hydrogen. Plasma hydrogenation (a hydrogenation process using hydrogen excited by a plasma) may be performed as another means of hydrogenation.

After the hydrogenation process is completed, a second interlayer insulating film 450 with a thickness of 500 nm to 1.5 µm is formed on the first interlayer insulating film 449. An 800 nm thick silicon oxide film is formed by plasma CVD as the second interlayer insulating film 450 in embodiment 1. An interlayer insulating film with a thickness of 1 µm is thus formed from a laminate film of the first interlayer insulating film 449 (oxidized silicon nitride film) and the second interlayer insulating film 450 (silicon oxide film).

Note that it is also possible to use an organic resin film such as polyimide, acrylic resin, polyamide, polyimide amide, and BCB (benzocyclobutane) as the second interlayer insulating film 450, provided that its heat resistance characteristics are acceptable during later processing.

Contact holes for reaching the source region or the drain region of the respective TFTs are formed next, and source wirings 451 to 454, and drain wirings 455 to 457 are formed. Note that in order to form the CMOS circuit, the drain wiring 455 is made common between the p-channel TFT and the n-channel TFT. Further, although not shown in the figures, a lamination film with a three layer structure formed by a 200 nm Ti film, a 500 nm aluminum film containing Ti, and a 100 nm Ti film formed by sputtering successively is used as the wirings in embodiment 1.

A silicon nitride film, a silicon oxide film, or an oxidized silicon nitride film having a thickness of 50 to 500 nm (typically between 200 and 300 nm) is formed as a passivation film 458. (See FIG. 7A.) Plasma processing is performed in advance at this point, in embodiment 1, using a gas containing hydrogen such as $H_2$ or $NH_3$, and heat treatment is performed after film deposition. Hydrogen excited by this preprocessing is supplied throughout the first and second interlayer insulating film. By performing heat treatment in this state, along with restoring the quality of the passivation film 458, the hydrogen added into the first and second interlayer insulating films diffuses underneath, and therefore the active layers can be effectively hydrogenated.

An additional hydrogenation process may be performed after forming the passivation film 458. For example, heat treatment may be performed for 1 to 12 hours at a temperature of 300 to 450° C. in an environment containing between 3 and 100% hydrogen, and a similar effect can be obtained by using plasma hydrogenation. Note that open sections (not shown in the figures) may also be formed in the passivation film 458, after the hydrogenation process, in locations at which contact holes for connecting the pixel electrode with the drain wiring are to be formed.

A third interlayer insulating film 459 is formed next from an organic resin with a thickness of approximately 1 µm. Materials such as polyimide, acrylic resin. polyamide, polyimide amide, and BCB (benzocyclobutane) can be used as the organic resin. The following can be given as the advantages of using an organic resin film: the film deposition method is simple; the specific dielectric constant is low, and therefore the parasitic capacity can be reduced; and super levelness. Note that organic resin films other than the ones stated above, and compounds such as an organic SiO can also be used. A thermally polymerizing type polyimide is used here, and this is fired at 300° C. after application to the substrate.

Next, a common electrode 460 is formed on the third interlayer insulating film 459 in the region which becomes the pixel portion. Note that the common electrode 460 may also be made to function as a shielding film for shielding from both light and electromagnetic waves. The common electrode 460 is formed with a thickness of between 100 and 300 nm from a film made up from an element selected from among the group consisting of aluminum (Al), titanium (Ti), and tantalum (Ta), or from a film having one of these elements as its principal constituent. A 125 nm thick aluminum film which contains 1 wt % titanium is formed in embodiment 1.

Note that if a 5 to 50 nm insulating film such as a silicon oxide film is formed on the third interlayer insulating film 459, then the adhesion of the common electrode formed thereon can be increased. Further, if plasma processing using $CF_4$ gas is performed on the surface of the third interlayer insulating film 459, formed from an organic resin, then the adhesion of the common electrode formed on the third interlayer insulating film 459 can be increased due to an improved surface quality.

In addition, it is possible to form not only the common electrode, but also connection wirings using an aluminum film containing titanium. For example, connection wirings which connect circuits within the driver circuit can be formed. In this case, however, it is necessary to form contact holes ahead of time in the third interlayer insulating film, before depositing the material which forms the common electrode or the connection wirings.

An oxide (anodic oxide) 461 is formed next on the surface of the common electrode 460 by anodic oxidation or plasma oxidation (anodic oxidation is used in embodiment 1) with a thickness of between 20 and 100 nm (preferably between 30 and 50 nm). Note that the common electrode is patterned into a completely connected state at this time in order to perform anodic oxidation. Note also that a certain small margin is opened in the edges of the common electrode so that they do not short with each other. A film with aluminum as its principal constituent is used in embodiment 1 as the common electrode 460, and therefore an aluminum oxide film (alumina film) is formed as the anodic oxide 461.

When performing anodic oxidation process, an ethylene glycol tartrate solution with a sufficiently small alkaline ion concentration is first manufactured. This is a solution in which a 15% aqueous solution of ammonium tartrate and ethylene glycol are mixed at a ratio of 2:8, and aqueous ammonia is added so that the pH is regulated to be 7±0.5. A platinum electrode is then formed in the solution as a cathode, the substrate on which the common electrode 460 has been formed is immersed in the solution, and a constant direct current (from several mA to several tens of mA) is applied with the common electrode 460 as an anode.

The voltage between the cathode and the anode in the solution changes with time in accordance with the growth of the anodic oxide. With a constant current, the voltage increases at a rate of 100 V/min, and the anodic oxidation process is stopped when the voltage reaches an arrival voltage of 45 V. The anodic oxide 461 can thus be formed with a thickness of approximately 50 nm on the surface of the common electrode 460 on the organic resin film. Compared with an anodic oxide film formed by a conventional anodic oxidation method, the anodic oxide film 461 formed by the above anodic oxidation method has less formation of the extra anodic oxide film in the edge section of the electrode, and film peeling does not easily develop. Furthermore, the film thickness of the common electrode 460 becomes 90 nm as a result. Note that the numerical values related to the anodic oxidation method shown here are only examples, and that they naturally should be changed to optimal values depending upon factors such as the size of the element being manufactured.

For cases of combining the function of a shielding film with the common electrode 460, three different starting film thickness conditions of an aluminum film (65 nm, 95 nm, and 125 nm) were tested and an anodic oxidation film was formed with a thickness of 50 nm under identical anodic oxidation conditions. As a result, the thickness of the electrode film which was not anodically oxidized became 30 nm, 60 nm, and 90 nm, respectively.

Figure 17:
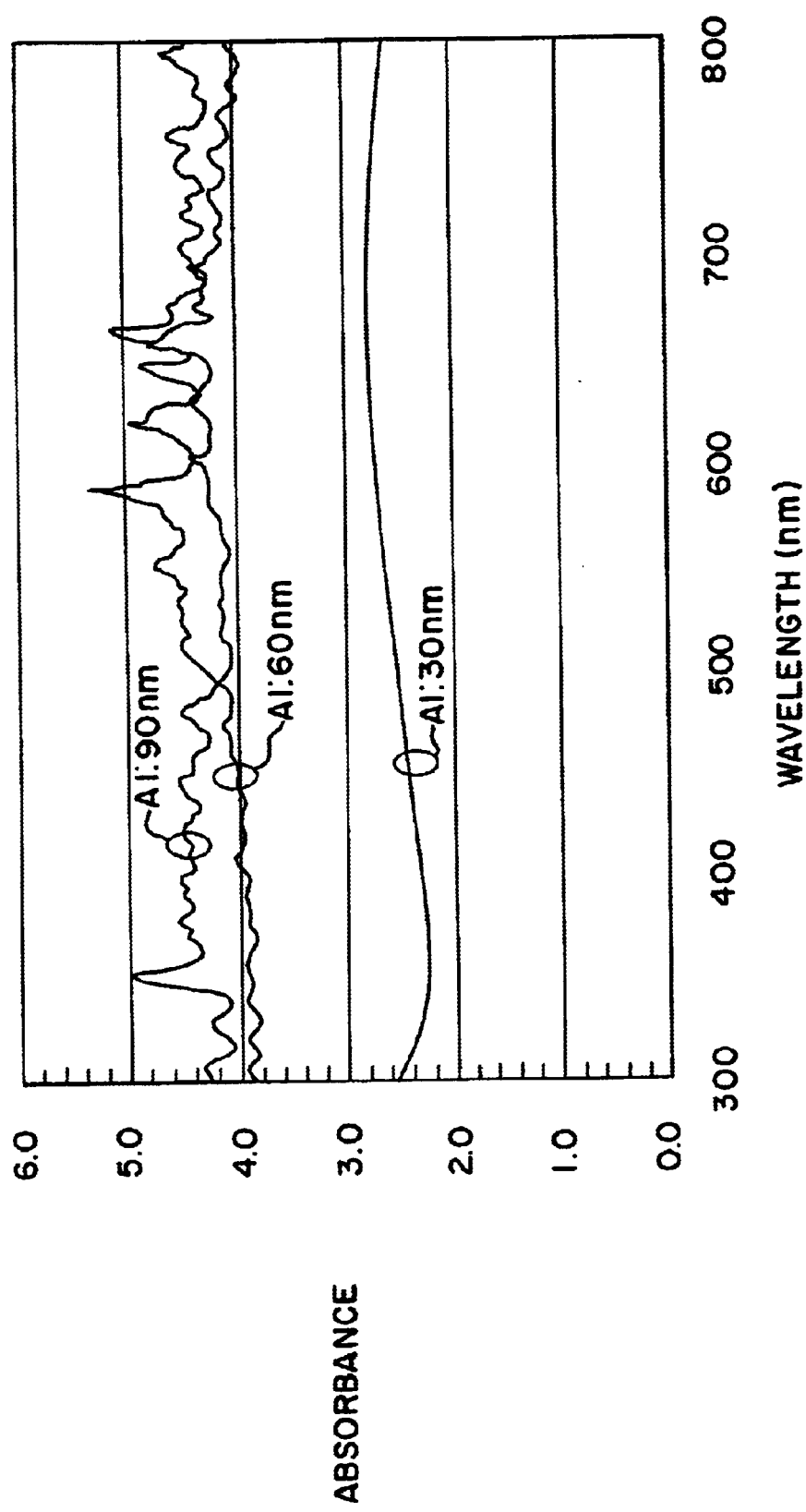
FIG. 17 is a diagram showing the light absorbency characteristics of an aluminum film.

The results, measured by using a Hitachi U-4000 spectrophotometer, are shown in FIG. 17. Reading from FIG. 17, at 550 nm the absorbance is 2.6 for the 30 nm film thickness electrode; the absorbance is 4 for the 60 nm film thickness electrode; and the absorbance is 4.6 for the 90 nm film thickness electrode. The necessary absorbance for cases in which the electrode is used as a shielding film is 3 or greater (at 550 nm). Therefore, with a 60 nm or greater film thickness, the electrode functions as a shielding film without any problem. Further, considering the leakage of light due to the amount of step change, a thin shielding film is preferable.

The common electrodes, which were connected at the time of anodic oxidation, are then cut apart, forming the common electrodes as shown in FIG. 1. Next, contact holes for reaching the drain wirings 457 are formed, in the third interlayer insulating film 459 and the passivation film 458, and a pixel electrode 462 is formed. The pixel electrode 462 may be formed by patterning a metallic film having conductivity and with a thickness of 100 to 300 nm, and an aluminum film is used in embodiment 1.

Furthermore, a storage capacitor 464 is formed at this point in the region where the pixel electrode 462 and the common electrode 460 overlap, through the anodic oxide 461. Note that, in this case, it is desirable to set the common electrode 460 to a floating state (an electrically isolated state) or to a fixed electric potential, preferably to a common electric potential (an intermediate electric potential of the image signal sent as data).

An element substrate having a driver circuit and a pixel portion on the same substrate is thus completed. Note that a p-channel TFT 601 and n-channel TFTs 602 and 603 are formed in the driver circuit in FIG. 7B, while a pixel TFT 604 is formed from an n-channel TFT in the pixel portion.

A channel forming region 501 is prepared in the p-channel TFT 601 of the driver circuit, and in addition a source region 502 and a drain region 503 are each formed in a p-channel impurity region (a). Strictly speaking, phosphorous is included in the source region 502 and in the drain region 503 at a concentration of $1 \times 10^{16}$ to $5 \times 10^{18}$ atoms/cm$^3$.

Further, a channel forming region 504, a source region 505, a drain region 506, and a region 507, between the channel forming region and the drain region, which overlaps a gate wiring through a gate insulating film (this type of region is referred to as an $L_{ov}$ region throughout this specification, where "ov" is attached to mean overlap) are formed in the n-channel TFT 602. The $L_{ov}$ region 507 contains phosphorous at a concentration of $2 \times 10^{16}$ to $5 \times 10^{19}$ atoms/cm$^3$, and is formed completely so as to overlap with the gate wiring.

Furthermore, a channel forming region 508, a source region 509, a drain region 510, and LDD regions 511 and 512, which are formed so as to sandwich the channel forming region, are formed in the n-channel TFT 603. In other words, an LDD region is formed between the source region and the channel forming region, and between the drain region and the channel forming region.

Note that, with this structure, a portion of the LDD regions 511 and 512 are placed so as to overlap with a gate wiring, and therefore a region overlapping the gate wiring through a gate insulating film ($L_{ov}$ region) and a region which does not overlap with the gate wiring (referred to as an $L_{off}$ region throughout this specification, where "off" is attached to mean offset) are realized.

In the pixel TFT 604, channel forming regions 513 and 514, a source region 515, a drain region 516, $L_{off}$ regions 517 to 520, and an n-type impurity region (a) contacting the $L_{off}$ regions 518 and 519 are formed. The source region 515 and the drain region 516 are each formed by an n-type impurity region (a) at this point, and the $L_{off}$ regions 517 to 520 are formed by an n-type impurity region (c).

The structure of the TFTs forming each of the circuits are optimized to correspond to the circuit specifications required from the pixel portion and the driver circuit, and the operation performance of the semiconductor device and its reliability can be increased by embodiment 1. Specifically, the LDD region placement in the n-channel TFT is made to differ depending upon the circuit specifications, and by using an $L_{ov}$ region or an $L_{off}$ region properly, TFT structures with high speed operation and which place great importance on measures to counter hot carriers, and TFT structures which place great importance on low off current operation, can be realized on the same substrate.

For the case of an active matrix type liquid crystal display device, for example, the n-channel TFT 602 is suitable for driver circuits which place great importance on high speed operation, such as a shift register circuit, a wave divider circuit, a signal divider circuit, a level shifter circuit, and a buffer circuit. In other words, by placing the $L_{ov}$ region only between the channel forming region and the drain region, this becomes a structure which reduces the resistive constituents as much as possible and places great importance on hot carrier countermeasures. This is because, for the case of the above circuit group, the functions of the source region and the drain region do not change, and the carrier (electron) movement direction is constant.

However, if necessary, $L_{ov}$ regions can be placed in both sides of the channel forming region. Namely, it is possible to form an $L_{ov}$ region between the source region and the channel forming region, and between the drain region and the channel forming region.

The n-channel TFT 603 is suitable for a sampling circuit (a sample hold circuit) which places emphasis on both hot carrier countermeasures and low off current operation. In other words, hot carrier countermeasures can be realized by placement of the $L_{ov}$ region, and in addition, low off current operation is realized by placement of the $L_{off}$ region. Furthermore, the functions of the source region and the drain region of a sampling circuit reverse, and then, the carrier movement direction changes by 180°; therefore a structure which has linear symmetry with the center of the gate wiring must be used. Note that it is possible to form only the $L_{ov}$ region, depending upon the circumstances.

The n-channel TFT 604 is suitable for a pixel portion or a sampling circuit (sample hold circuit) which place great importance on low off current operation. Namely, the $L_{ov}$ region, which is a cause of an increase in the off current value, is not employed, only the $L_{off}$ region is used, allowing low off current operation to be realized. Furthermore, by utilizing an LDD region with a concentration lower than that of the driver circuit LDD region as the $L_{off}$ region, although the on current value will fall a little, it is a thorough measure for lowering the off current value. Additionally, it has been confirmed that an n-type impurity region (a) 521 is extremely effective in lowering the off current value.

Further, the length (width) of the $L_{ov}$ region 507 of the n-channel TFT 602 may be between 0.3 and 3.0 μm, typically from 0.5 to 1.5 μm, for a channel length of 3 to 7 μm. Further, the length (width) of the $L_{ov}$ regions 511a and 512a of the n-channel TFT 603 may be from 0.3 to 3.0 μm, typically between 0.5 and 1.5 μm, and the length (width) of the $L_{off}$ regions 511b and 512b may be from 1.0 to 3.5 μm, typically between 1.5 and 2.0 μm. Moreover, the length (width) of the $L_{off}$ regions 517 to 520 formed in the pixel TFT 604 may be from 0.5 to 3.5 μm, typically between 2.0 and 2.5 μm.

Further, by using an alumina film having a high specific dielectric constant of 7 to 9 as a storage capacitor dielectric in embodiment 1, the exclusive surface area required by the storage capacitor in order to form the necessary capacitance can be reduced. In addition, by making the common electrode formed on the pixel TFT into one electrode of the storage capacitor, as in embodiment 1, the aperture ration of the pixel portion of the liquid crystal display device can be increased.

A process of manufacturing an active matrix type liquid crystal display device from an active matrix substrate is explained here. As shown in FIG. 8, an alignment film 801 is formed on the active matrix substrate in the state of FIG. 7B. A polyimide resin film is used for the alignment film in embodiment 1. Further, an alignment film 803 is formed on an opposing substrate 802. Note that a color filter or a shielding film may be formed on the opposing substrate, if necessary.

Figure 22A:
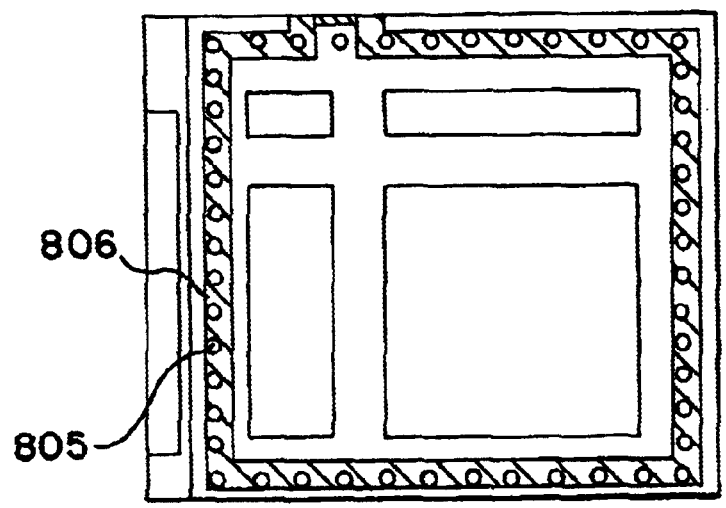
FIGS. 22A and 22B are diagrams showing examples of top views of LCD panels.
Figure 22B:
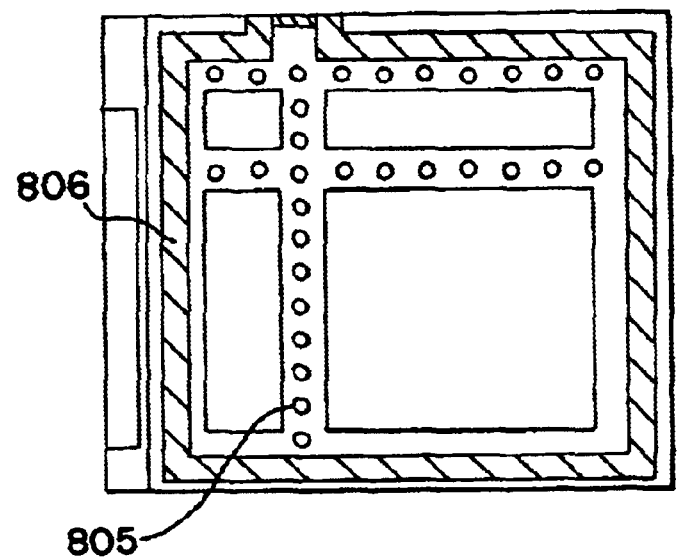

After forming the alignment films, a rubbing process is performed to give the liquid crystal molecules a certain fixed pre-tilt angle, bringing them into alignment. The active matrix substrate, on which the pixel portion and the driver circuit are formed, and the opposing substrate are then joined together by a material such as spacers 805, in accordance with a known cell construction process. Note, however, that the spacers 805 should be placed in regions that avoid the region in which the storage capacitor is formed, in order to prevent the development of short circuits when a stress is applied between the substrates. Further, in order to maintain uniformity in the space between the substrates, it is good that a liquid crystal layer is surrounded by a sealing material 806, and that the spacers are formed in the region in which the sealing material 806 is formed as shown in FIG. 22A. In addition, in the driver circuit, it is good to place the spacers 805 in regions in which the driver circuit elements do not exist as shown in FIG. 8, and it is good to form spacers in the region between the region of the pixel portion in which the pixel electrode is formed, and the driver circuit as shown in FIG. 22B. Furthermore, if a spacer 805 is formed on the contact portion of the concave pixel electrode 462, then the development of disclination can be reduced.

Next, a liquid crystal material 804 is injected between both substrates, and the cell is completely sealed by the sealing material 806. A known n-type liquid crystal or a known p-type liquid crystal using the IPS method may be used as the liquid crystal 804. Thus the liquid crystal display device shown in FIG. 8 is completed.

The structure of the active matrix type liquid crystal display device is explained next using the perspective view of FIG. 9. The liquid crystal display device is constituted by a pixel portion 901, a scanning (gate) line driver circuit 902, and a signal (source) driver circuit 903 formed on the quartz substrate 401. The pixel TFT of the pixel portion is an n-channel TFT, and the driver circuit formed in the periphery of the pixel portion is structured by a CMOS circuit as a basic circuit. The scanning line driver circuit and the signal line driver circuit are connected to the pixel portion 901 by a gate wiring and a source wiring, respectively. Further, connection wirings 906 and 907 are formed from an external input-output terminal 905 connected to an FPC (flexible printed circuit) 904 to an input-output terminal of the driver circuit.

Figure 9:
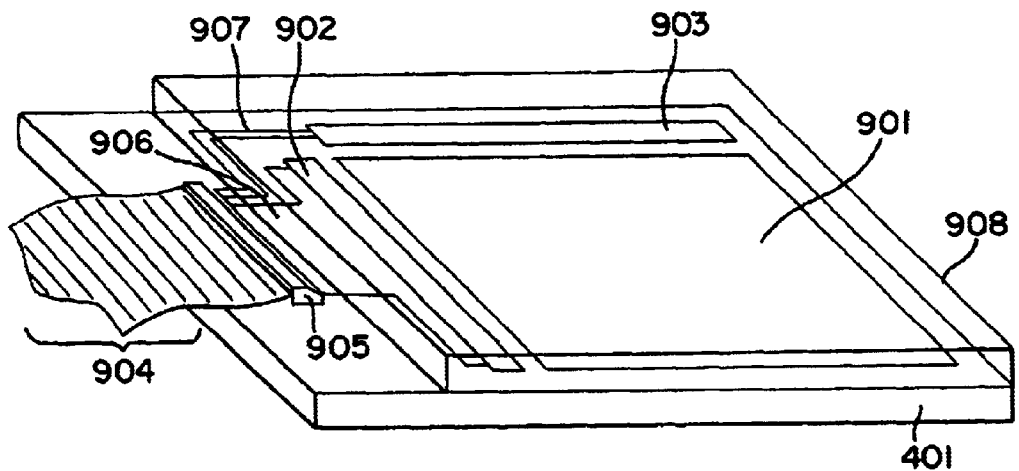
FIG. 9 is a diagram showing an external view of an LCD.
Figure 10:
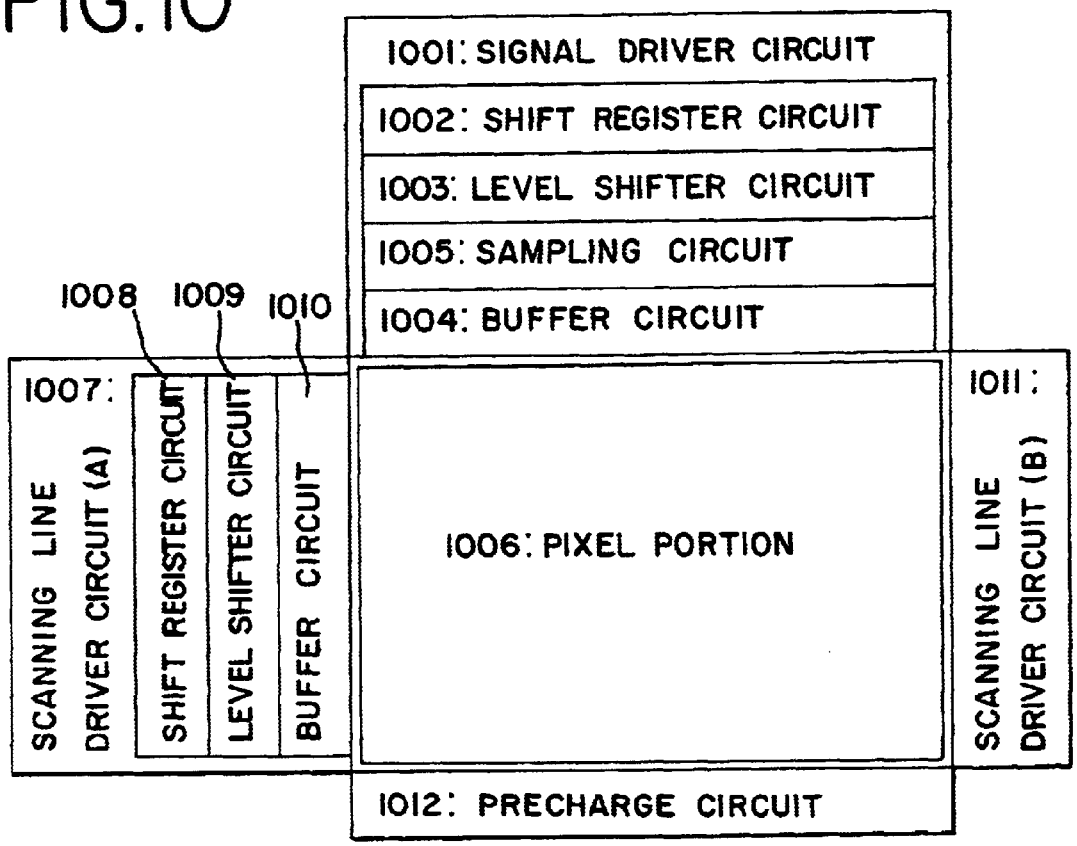
FIG. 10 is a diagram showing an liquid crystal display device circuit.

An example of circuit structure of the liquid crystal display device shown in FIG. 9 is shown next in FIG. 10. A liquid crystal display device of the present embodiment comprises a signal line driver circuit 1001, a scanning line driver circuit (A) 1007, a scanning line driver circuit (B) 1011, a pre-charge circuit 1012 and a pixel portion 1006. Note that through the specification the signal line driver circuit 1001, the scanning line driver circuit (A) 1007 and the scanning line driver circuit (B) 1011 are included in the driver circuit.

A signal line driver circuit 1001 comprises a shift resister circuit 1002, a level shifter circuit 1003, a buffer circuit 1004 and a sampling circuit 1005. A scanning line driver circuit (A) 1007 comprises a shift register circuit 1008, a level shifter circuit 1009 and a buffer circuit 1010. A scanning line driver circuit (B) 1011 has a similar structure.

Note that the constitutions of the present embodiment can be easily materialized by fabricating TFTs in accordance with the processes shown in FIGS. 4A to 8. Though the present embodiment shows only the structures of pixel portion and driver circuit, it is possible to form a signal divider circuit, a frequency divider circuit, a D/A converter circuit, an operational amplifier circuit, a g compensation circuit and further signal processing circuits (they may also be referred to as logic circuits) such as micro processor circuits over a same substrate by following the manufacturing method of Embodiment 1.

As stated above, the present invention enables materializing a semiconductor device which comprises at least a pixel portion and a driver circuit for driving the pixel portion over a same substrate, for example a semiconductor device having a signal processing circuit, a driver circuit, a pixel portion and a storage capacitance over a same substrate.

Further, a crystalline silicon film having a unique crystal structure in which crystal lattice is continuous is formed by performing processes up to FIG. 5B of the present Embodiment. The characteristic of the crystalline structure which is experimentally tested by the Applicant is described in details. Note that this characteristics coincide with the The above stated crystalline silicon film has a crystal structure in which a plurality of needle-like or bar-like crystals (hereinafter referred to as bar-like crystals) are gathered and placed side by side, when seen microscopically. This is easily confirmed by observation using a TEM (transmission electron microscope).

Further, it has been confirmed by using electron beam diffraction and x-ray diffraction that the principal orientation face is {110} on the surface of the crystalline silicon film (the channel forming portion), although there is some crystal axis deviation. When analysis is performed by using electron beam diffraction, it is found that the diffraction spot appeared cleanly in correspondence to the {110} face. Further, it is visible that each spot had a concentric distribution.

Furthermore, when the crystal grain boundaries formed by contact of each of bar-like crystals is observed by using an HR-TEM (high resolution transmission electron microscope, it is confirmed that the crystal lattice has continuity in the grain boundaries. This was easily verified by the continuous connection of the observed lattice stripes in the grain boundaries.

Note that the continuity of the crystal lattice in the crystal grain boundaries originates in the fact that the crystal grain boundaries are grain boundaries that are referred to as "planar boundary." The definition of the planar boundary in this specification is "planar boundary" described in "Characterization of High-Efficiency Cast-Si Solar Cell Wafers by MBIC Measurement, Ryuichi Shimokawa and Yutaka Hayashi, Japanese Journal of Applied Physics vol. 27, No. 5, pp. 751–8, 1988."

According to the above paper, planar boundary include twin crystal grain boundaries, special stacking defects, special twist grain boundaries, etc. This planar boundary possesses a characteristic in that it is not electrically active. Namely, the grain boundaries can essentially be seen as non-existent because they do not function as a trap that obstructs the movement of a carrier.

Particularly for cases in which the crystal axis (the axis perpendicular to the crystal face) is the <110> axis, {211} twin crystal grain boundaries is also referred to as grain boundaries corresponding to Σ3. The Σ value is a parameter that indicates the degree of matching in corresponding grain boundaries, and it is known that smaller Σ values signify good grain boundary matching.

When a crystalline silicon film of the present embodiment is actually observed in detail by using TEM, it is found that most of the crystal grain boundaries (more than 90%, typically more than 95%) had grain boundaries corresponding to Σ3, typically, {211} twin grain boundaries.

In a crystal grain boundary formed between 2 crystal grains, it is known that the grain boundary becomes a grain boundary corresponding to Σ3 when an angle θ between lattice stripes corresponding to {111} plane is 70.5°, in case that plane orientation of both crystals are {110}. Each lattice stripe of the neighboring crystal boundaries is continued at an angle of 70.5° in the crystal grain boundary of a crystalline silicon film of the present embodiment, and accordingly it can be said that the crystal grain boundaries are grain boundaries corresponding to Σ3.

Note that a grain boundary is grain boundary corresponding to Σ9 when θ=38.9°, and other crystal grain boundaries like this also exist. In any case, there is no difference to the fact that it is inactive.

This type of corresponding grain boundary is only formed between crystal grains in the same face orientation. In other words, the crystalline silicon film of the present embodiment has a face orientation roughly matched to {110}, and therefore this corresponding grain boundary is formed over a wide range.

This type of crystal structure (literally, crystal grain boundary structure) shows that two different crystal grains are joined together with very good matching in the grain crystal boundaries. Namely, it is a structure in which crystal lattice is continuously joined in the crystal grain boundaries, and in which a trap level caused by crystal defects, etc are scarecely formed. Therefore it is possible to regard the semiconductor thin films having this type of crystal structure as ones in which crystal grain boundaries do not substantially exist.

Further, it has been confirmed by TEM observation that defects within the crystal grain almost completely disappeared with a heat treatment process (a thermal oxidation process in this embodiment) at a high temperature of 800 to 1150° C. It is also clear from the fact that the number of defects notably decreased after the heat treatment process.

The difference in the number of defects appears as the difference in spin density by electron spin resonance (ESR). At present, it is found that crystalline silicon films of the present embodiment have a spin density at least $5 \times 10^{17}$ spins/cm$^3$ or less (preferably $3 \times 10^{17}$ spins/cm$^3$ or less). However, this measurement value is near the detection limits of the present measuring equipment, and it is expected that the actual spin density is even lower.

From the above, the crystalline silicon film of the present embodiment may be regarded as a single crystal silicon film or an essentially single crystal silicon film because the number of defects in a crystal grain is notably small and the crystal grain boundaries do not substantially exist.

Embodiment 2

Figure 11A:
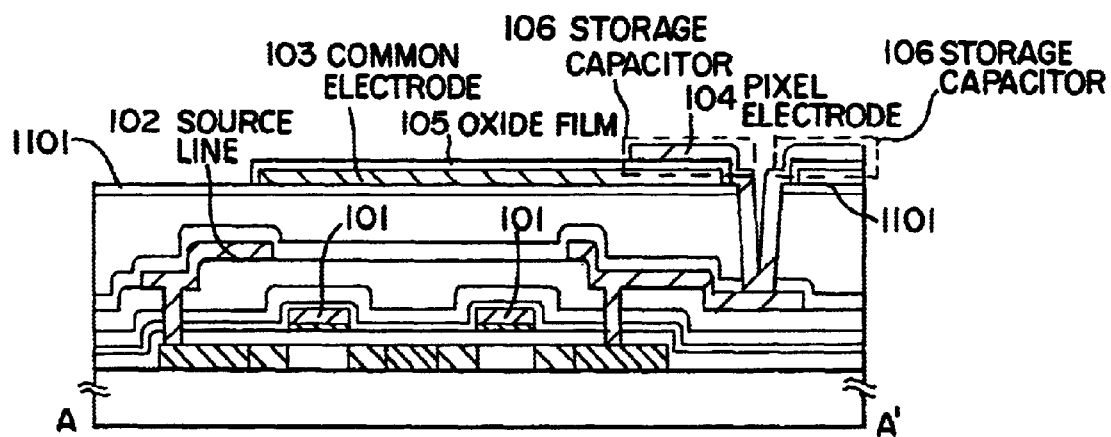
FIGS. 11A to 11C are diagrams showing examples of the structure of a storage capacitor.
Figure 11B:
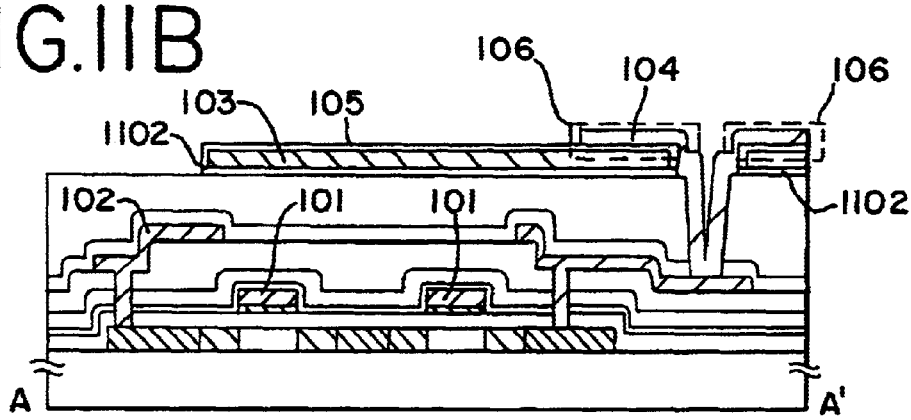
Figure 11C:
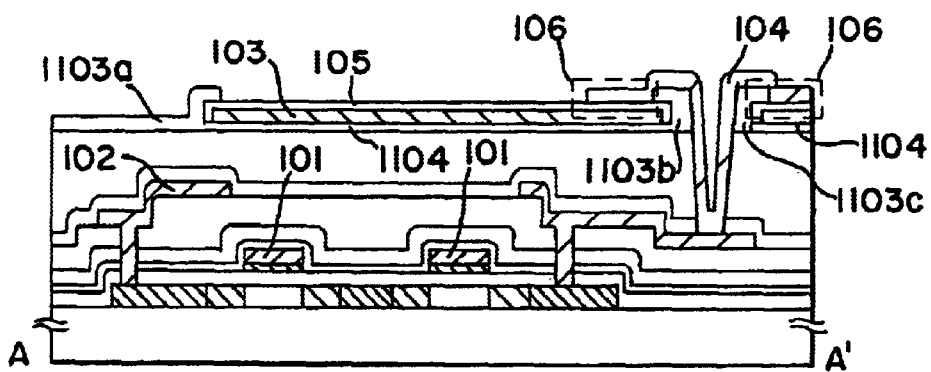

FIGS. 11A to 11C are used in embodiment 2 to explain a case of a pixel portion structure which differs from that of embodiment 1. Note that the basic structure is the same structure as that shown in FIG. 1B, and therefore only points of difference are explained. Consequently, the same symbols are used for identical portions.

FIG. 11A is a cross sectional diagram of the pixel portion of embodiment 2, and is an example of forming a buffer layer 1101 between an interlayer insulating film (organic resin film) and the common electrode 103. An insulating film containing silicon with a thickness of between 10 and 100 nm (preferably between 30 and 50 nm) is used as the buffer layer 1101. However, in forming the buffer layer on the organic resin film, there is a problem of degasification from within the resin film if it is exposed to a vacuum, and therefore it is preferable to use an insulating film which can be formed by sputtering.

A 50 nm thick silicon oxide film is used in embodiment 2 as the buffer layer 1101. By forming the buffer layer, the adhesion of the organic resin film with the common electrode 103 is increased. When forming the oxide film 105 by anodic oxidation as in embodiment 1, if the adhesion is poor, then defects develop in the formation of the anodic oxide in which it wraps around the interface between the organic resin film and the common electrode. However, by using the structure shown in FIG. 11A, this type of defect can be prevented.

Further, the structure of FIG. 11B is similar to that of FIG. 11A, but this is an example in which a buffer layer 1102 is formed in a self-aligning manner beneath the common electrode 103. In this case, the structure of FIG. 11B can be realized by performing etching of the buffer layer in a self-aligning manner with the common electrode 103 as a mask.

The etching process may be performed directly after the common electrode 103 is formed, and it may be performed after forming the oxide film 105. However, for a case in which the material of the buffer layer 1102 and the oxide film 105 material are both etched by the same etchant, it is preferable to perform the etching process before forming the oxide film 105.

Furthermore, it is beneficial to use the structure of FIG. 11B when opening contact holes in the third interlayer insulating film. If a film such as a silicon oxide film exists on the organic resin film, then there is a danger that the silicon oxide film will remain in an overhang state when the organic resin film is etched. It is thus preferable to remove the buffer layer in advance in positions where the contact holes are to be formed, as in the structure of FIG. 11B.

The structure of FIG. 11C shows an example of forming spacers 1103a to 1103c from an insulating film after formation of the common electrode 103 and the oxide film 105, and then forming the pixel electrode 104. An organic resin film is preferable as the material of the spacers 1103a to 1103c, and in particular, it is preferable to use polyimide or acrylic, which have photosensitivity.

With a structure like that of FIG. 11C, the edge portions of the common electrode 103 are hidden by spacers, and therefore short circuits between the common electrode and the pixel electrode in the edge portions of the common electrode 103 can be prevented.

Note that the structure of embodiment 2 has changes in the manufacturing processes of embodiment 1 only from the formation of the third interlayer insulating film to the formation of the pixel electrode, and that other processes may be performed similar to those of embodiment 1. Therefore, it is possible to apply the structure of embodiment 2 to the liquid crystal display device shown in embodiment 1.

Embodiment 3

Figure 12:
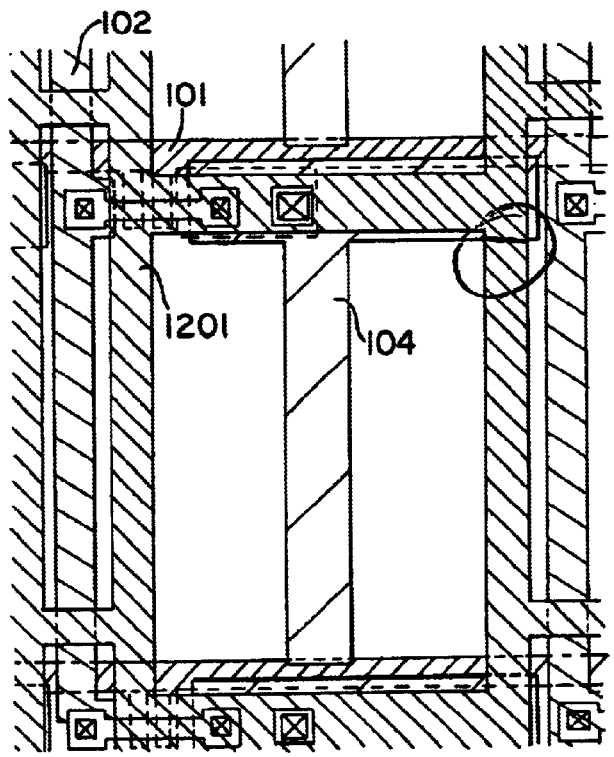
FIG. 12 is a diagram showing an example of a top view of a pixel portion.
Figure 13:
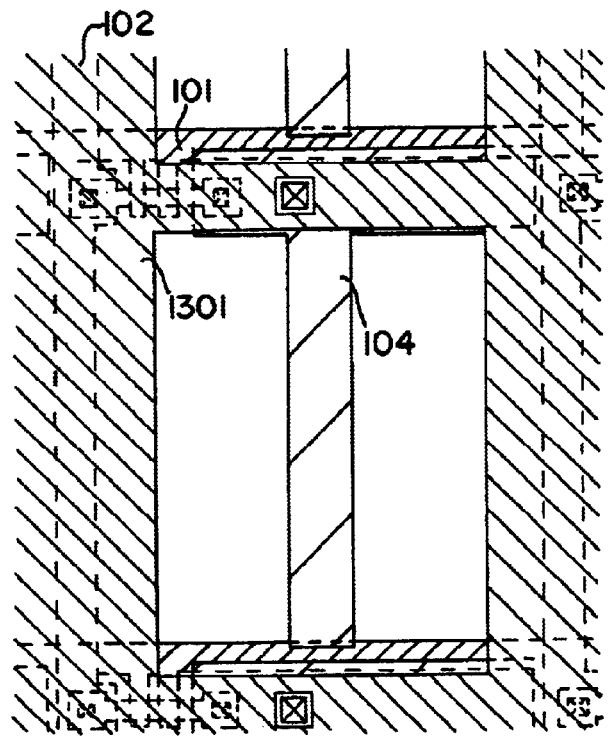
FIG. 13 is a diagram showing an example of a top view of a pixel portion.

In embodiment 3, a case of the shape of the common electrode of the pixel portion differing from that of embodiment 1 is explained using FIG. 12 and FIG. 13. Note that the basic structure is the same structure as that shown in FIG. 1A, and therefore only points of difference are explained. Consequently, the same symbols are used for identical portions.

In order to set the common electrode to a common electric potential (an intermediate electric potential of the image signal sent as data) in embodiment 3, a common electrode 1201 with a shape connected to each of the common electrodes is formed. By then electrically connecting an electric power supply line for imparting a common electric potential to the common electrode 1201, outside of the pixel portion, the common electrode 1201 can be maintained at the common electric potential. Note that when the common electrode 1201 is used, the step of cutting apart after anodic oxidation can be omitted, and therefore the processes can be simplified.

Further, a shape in which the TFT is completely covered, shielding from light and electromagnetic waves, may be used as the common electrode 1301 shape, as shown in FIG. 13. In this case as well, the step of cutting apart after anodic oxidation can be omitted, and therefore the processes can be simplified.

Note that it is possible to realize the structure of embodiment 3 by changing only a portion of the manufacturing processes of embodiment 1 (such as the patterning of the commion electrode), and that other processes may be performed similar to those of embodiment 1. It is possible, therefore, to apply the structure of embodiment 3 to the liquid crystal display device shown in embodiment 1. Furthermore, it is possible to freely combine the structure of embodiment 3 with the structure shown in embodiment 2.

Embodiment 4

Figure 14A:
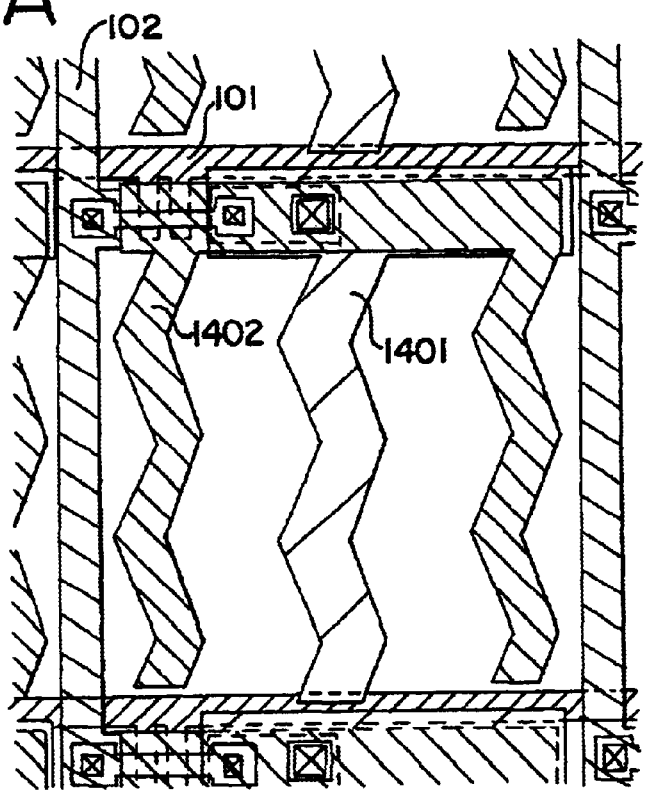
FIGS. 14A and 14B are diagrams showing examples of a top view of a pixel portion.
Figure 14B:
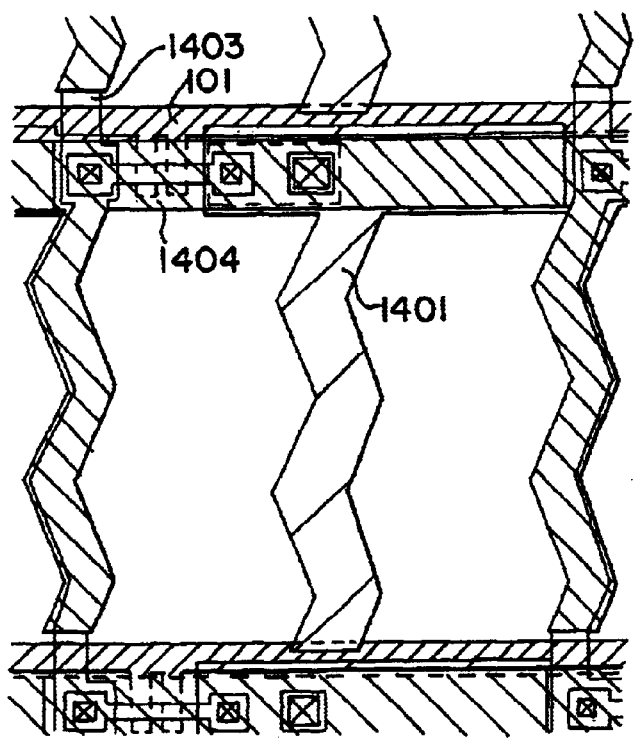

A case in which the shape of the pixel electrode and the common electrode of the pixel portion differ from that of embodiment 1 is explained using FIGS. 14A and 14B in embodiment 4. Note that the basic structure is the same structure as that shown in FIG. 1A, and therefore only the points of difference are explained. Consequently, the same symbols are used for identical portions.

As shown in FIG. 14A, a pixel electrode 1401 having a zig-zag shape, and a common electrode 1402 having a zig-zag shape are formed. By doing so, two kinds directions of the electric field applied to the liquid crystal are formed, and display characteristics can be improved.

Further, as shown in FIG. 14B, the shape of a source line is changed in accordance with the zig-zag shape of a common electrode 1404, and made into a source line 1403. The aperture ratio can be increased by doing so. However, considering a parasitic capacitance formed between the source line and the common electrode, it is preferable to change the shape.

Note that it is possible to realize the structure of embodiment 4 by changing only a portion of the manufacturing processes of embodiment 1, and that other processes may be performed similar to those of embodiment 1. It is possible, therefore, to apply the structure of embodiment 4 to the liquid crystal display device shown in embodiment 1. Furthermore, it is possible to freely combine the structure of embodiment 4 with the structure shown in embodiment 2.

Embodiment 5

Figure 15A:
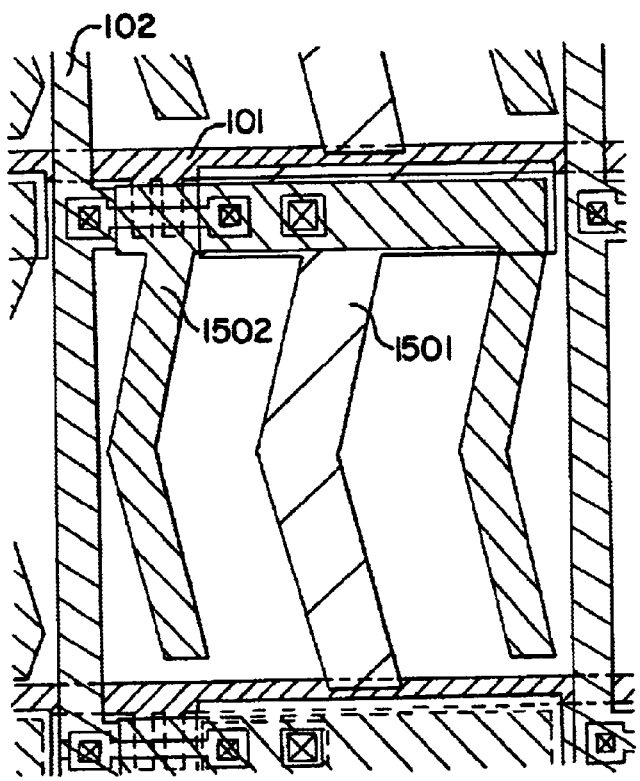
FIGS. 15A and 15B are diagrams showing examples of a top view of a pixel portion.
Figure 15B:
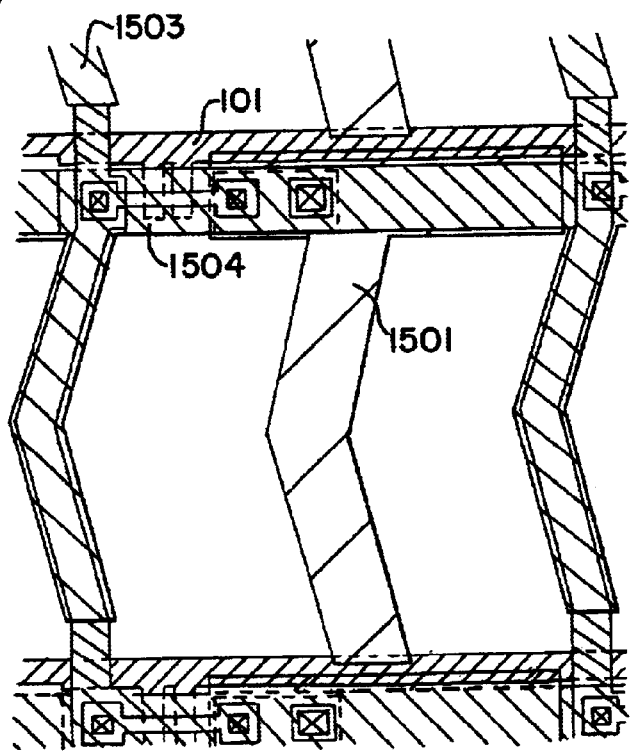

A case in which the shape of the pixel electrode and the common electrode of the pixel portion differ from that of embodiment 1 is explained using FIGS. 15A and 15B in embodiment 5. Note that the basic structure is the same structure as that shown in FIG. 1A, and therefore only the points of difference are explained. Consequently, the same symbols are used for identical portions.

As shown in FIG. 15A, a pixel electrode 1501 having a "<" character shape, and a common electrode 1502 having a "<" character shape are formed. By doing so, two kinds directions of the electric field applied to the liquid crystal are formed, and display characteristics can be improved.

Further, as shown in FIG. 15B, the shape of a source line is changed in accordance with the zig-zag shape of a common electrode 1504, and made into a source line 1503. The aperture ratio can be increased by doing so. However, considering a parasitic capacitance formed between the source line and the common electrode, it is preferable to change the shape.

Note that it is possible to realize the structure of embodiment 5 by changing only a portion of the manufacturing processes of embodiment 1, and that other processes may be performed similar to those of embodiment 1. It is possible, therefore, to apply the structure of embodiment 5 to the liquid crystal display device shown in embodiment 1. Furthermore, it is possible to freely combine the structure of embodiment 5 with the structure shown in embodiment 2.

Embodiment 6

Figure 16A:
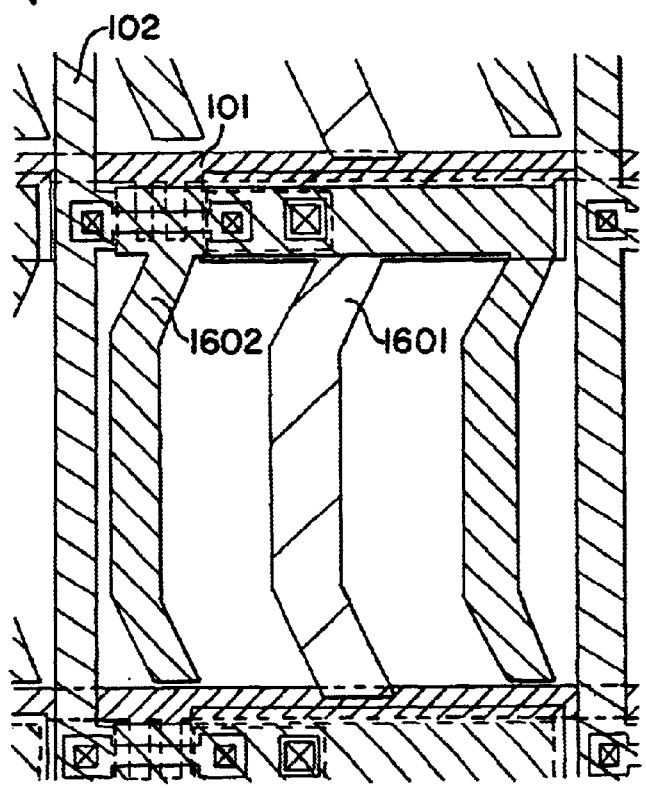
FIGS. 16A and 16B are diagrams showing examples of a top view of a pixel portion.
Figure 16B:
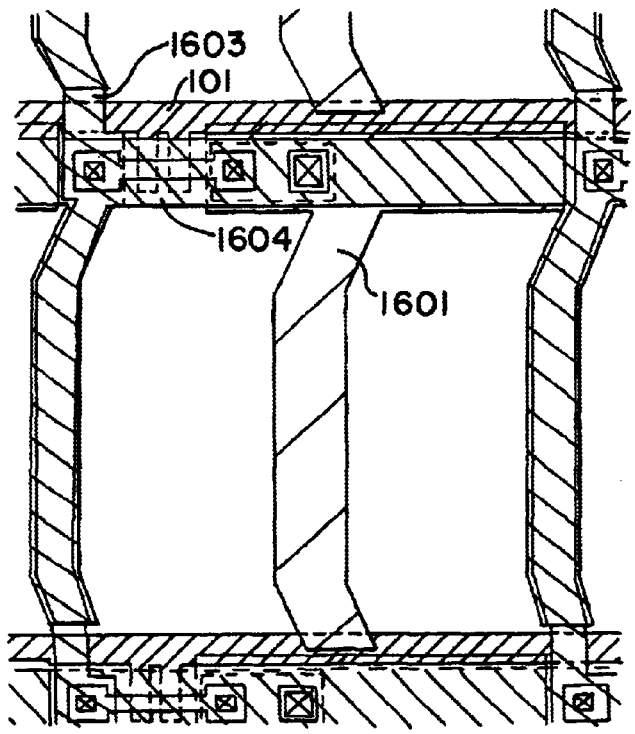

A case in which the shape of the pixel electrode and the common electrode of the pixel portion differ from that of embodiment 1 is explained using FIGS. 16A and 16B in embodiment 6. Note that the basic structure is the same structure as that shown in FIG. 1A, and therefore only the points of difference are explained. Consequently, the same symbols are used for identical portions.

A pixel electrode 1601 and a common electrode 1602 having the shapes shown in FIG. 16A are formed. By doing so, three kinds directions of the electric field applied to the liquid crystal are formed, and display characteristics can be improved.

Further, the shape of a source line is changed in accordance with the shape of a common electrode 1604 shown in FIG. 16B, and made into a source line 1603. The aperture ratio can be increased by doing so. However, considering a parasitic capacitance formed between the source line and the common electrode, it is preferable to change the shape.

Note that it is possible to realize the structure of embodiment 6 by changing only a portion of the manufacturing processes of embodiment 1, and that other processes may be performed similar to those of embodiment 1. It is possible, therefore, to apply the structure of embodiment 6 to the liquid crystal display device shown in embodiment 1. Furthermore, it is possible to freely combine the structure of embodiment 6 with the structure shown in embodiment 2.

Embodiment 7

Another structure in the pixel portion is explained in embodiment 7.

Note that only points which differ from those of embodiment 1 are focused on and explained in embodiment 7.

Embodiment 7 has a structure in which color filters having the three primary colors of R, G, and B are formed between a pixel TFT and a pixel electrode. Each R, G, and B color arrangement may have a stripe shape or a mosaic shape.

First, the passivation film 458 is formed in accordance with embodiment 1, and a color filter is formed on the passivation film. A color filter 1601 also functions as a leveling film. Next, at the same time as the color filter is patterned, or after forming the color filter, an ITO contact opening is made in advance. A second interlayer insulating film is then formed, and a shielding layer is formed on the second interlayer insulating film. The same manufacturing method as in embodiment 1 are used for further processing, and an anodic oxide film, and an organic resin film as a third interlayer insulating film are formed. The third interlayer insulating film, the second interlayer insulating film, and the passivation film 458 are next etched, forming contact holes, and a pixel electrode is formed from the same material as in embodiment 1. A storage capacitor is constituted by the shielding layer, the anodic oxide film, and the pixel electrode.

Further, it is possible to freely combine the structure of embodiment 7 with the structure of any of embodiments 1 to 6.

Embodiment 8

Figure 18:
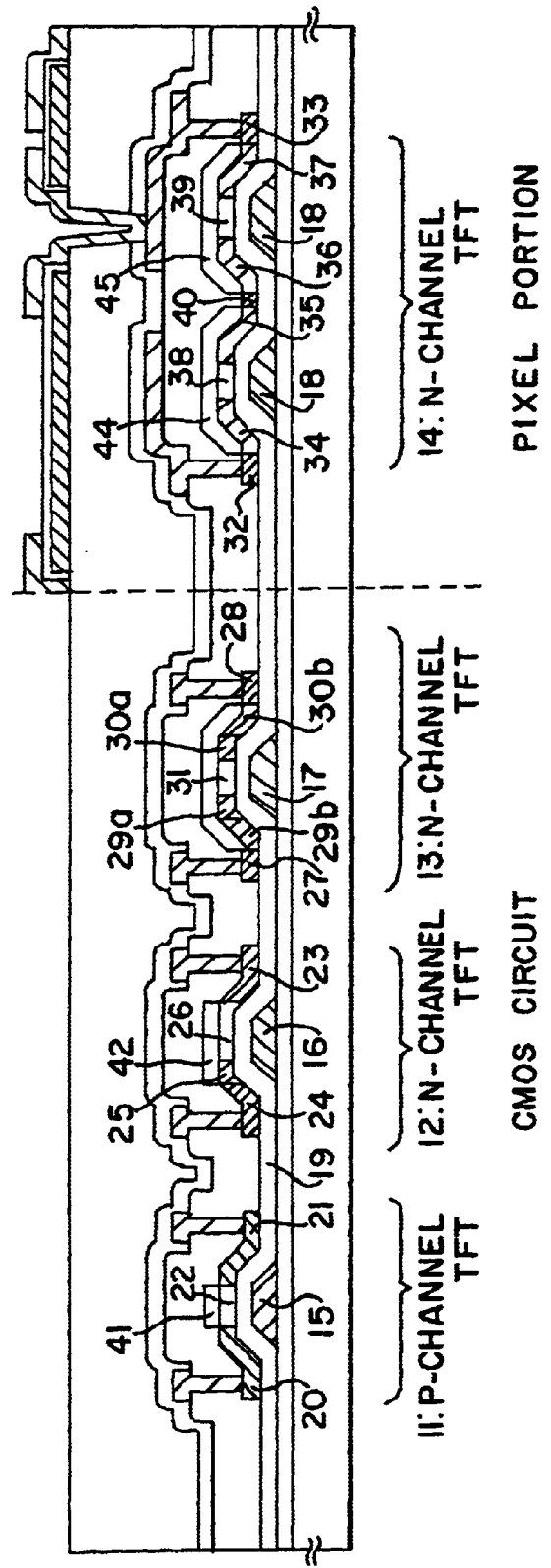
FIG. 18 is a diagram showing an example of the structure of a TFT.

A case in which a bottom gate TFT is used for the present invention is explained in embodiment 8. Specifically, the case of a reverse stagger type TFT being used is shown in FIG. 18. Aside from the positional relationship between gate wirings and active layers, the use of the reverse stagger type TFT for the present invention does not differ much from the top gate type TFT of embodiment 1. Therefore, an explanation is made in embodiment 8 which focuses on the points which differ greatly from the structure shown in FIG. 7B, and the explanation of other portions is omitted because it is the same as that of FIG. 7B. A storage capacitor is formed from a shielding film, an anodic oxidation film of the shielding film, and a pixel electrode, the same as in embodiment 1. The anodic oxidation film is formed by the method shown in the embodiment mode of the present invention.

In FIG. 18, reference numerals 11 and 12 denote a p-channel TFT and an n-channel TFT, respectively, of a CMOS circuit forming a shift register circuit. Reference numeral 13 denotes an n-channel TFT forming a sampling circuit, and reference numeral 14 denotes an n-channel TFT forming a pixel portion. These TFTs are all formed on a substrate on which has a base film formed.

Further, reference numeral 15 denotes a gate wiring of the p-channel type TFT 11, 16 denotes a gate wiring of the n-channel TFT 12, 17 denotes a gate wiring of the n-channel TFT 13, and 18 denotes a gate wiring of the n-channel type TFT 14. The same materials as for the gate wirings explained in embodiment 1 can be used to form the gate wirings here. In addition, reference numeral 19 denotes a gate insulating film, and this can also be formed by using the same materials as those of embodiment 1.

An active layer is formed on top for each of the TFTs 11 to 14. A source region 20, a drain region 21, and a channel forming region 22 are formed in the active layer of the p-channel TFT 11.

Further, a source region 23, a drain region 24, an LDD region (in this case, an $L_{ov}$ region 25), and a channel forming region 26 are formed in the active layer of the n-channel TFT 12.

Furthermore, a source region 27, a drain region 28, LDD regions (in this case, $L_{ov}$ regions 29a and 30a, and $L_{off}$ regions 29b and 30b), and a channel forming region 31 are formed in the n-channel TFT 13.

Moreover, a source region 32, a drain region 33, LDD regions (in this case, $L_{off}$ regions 34 to 37), channel forming regions 38 and 39, and an $n^+$ region 40 are formed in the n-channel TFT 14.

Note that insulating films denoted by reference numerals 41 to 45 are formed with the purpose of protecting the channel forming regions, and with the purpose of forming the LDD regions.

It is easy to apply the present invention to a bottom gate TFT, typically the reverse stagger TFT, as above. Note that the manufacturing processes shown in other embodiments recorded in this specification can be applied to known reverse stagger type TFT manufacturing processes for the manufacture of the reverse stagger TFT of embodiment 8.

Furthermore, it is possible to freely combine the structure of embodiment 8 with the structure of any of embodiments 1 to 7.

Embodiment 9

Pixel portion formed by implementing the present invention can be used in various electro-optical devices (active matrix liquid crystal displays). In other words, the present invention can be applied to all of the electronic devices having these electro-optical devices as the display section.

The following can be given as examples of this type of electronic devices: video cameras; digital cameras; projectors (rear type or front type); head mounted displays (goggle type display); car navigation systems; car stereos; personal computers; portable information terminals (such as mobile computers, portable telephones and electronic notebooks etc). Some examples of these are shown in FIGS. 19A to 19F, 20A to 20D and 21A to 21C.

Figure 19A:
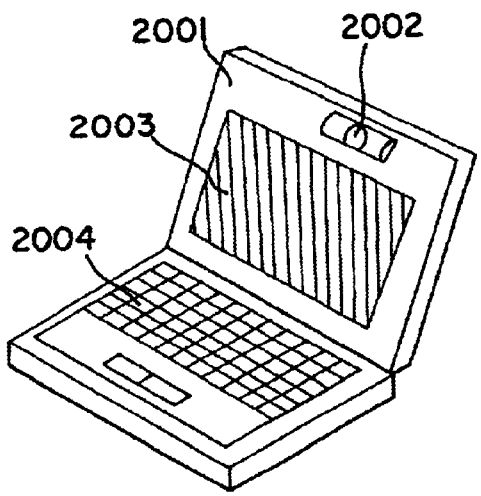
FIGS. 19A to 19F are diagrams showing examples of electronic equipment.

FIG. 19A is a personal computer, which comprises: a main body 2001; an image input section 2002; a display section 2003; and a keyboard 2004 etc. The present invention can be applied to the display section 2003.

Figure 19B:
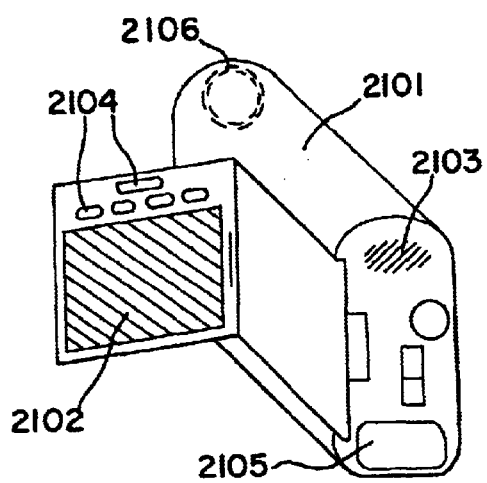

FIG. 19B is a video camera, which comprises a main body 2101; a display section 2102; a voice input section 2103; operation switches 2104; a battery 2105; and an image receiving section 2106 etc. The present invention can be applied to the display section 2102.

Figure 19C:
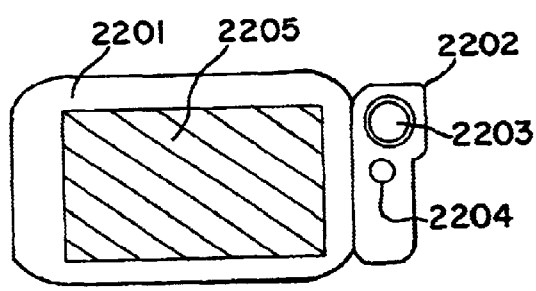

FIG. 19C is a mobile computer, which comprises: a main body 2201; a camera section 2202; an image receiving section 2203; operation switches 2204; and a display section 2205 etc. The present invention can be applied to the display section 2205.

Figure 19D:
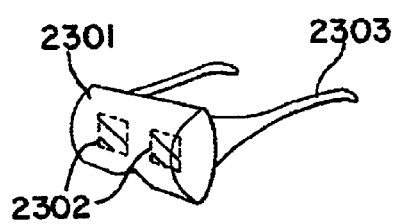

FIG. 19D is a goggle type display, which comprises a main body 2301; display section 2302; and arm sections 2303 etc. The present invention can be applied to the display section 2302.

Figure 19E:
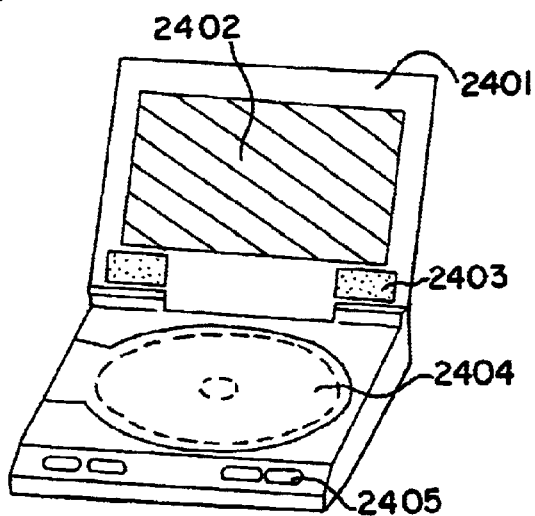

FIG. 19E is a player that uses a recording medium on which a program is recorded (hereinafter referred to as a recording medium), which comprises: a main body 2401; a display section 2402; a speaker section 2403; a recording medium 2404; and operation switches 2405 etc. Note that music appreciation, film appreciation, games, and the use of the Internet can be performed with this device using a DVD (digital versatile disk), a CD, etc., as a recording medium. The present invention can be applied to the display section 2402.

Figure 19F:
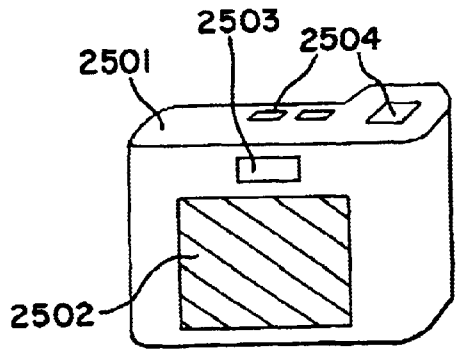

FIG. 19F is a digital camera, which comprises: a main body 2501; a display section 2502; a viewfinder 2503; operation switches 2504; and an image receiving section (not shown in the figure). The present invention can be applied to the display section 2502.

Figure 20A:
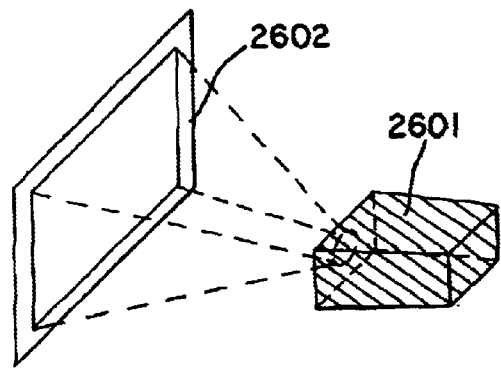
FIGS. 20A to 20D are diagrams showing examples of electronic equipment.

FIG. 20A is a front type projector, which comprises a projector device 2601 and a screen 2602 etc. The present invention can be applied to the liquid crystal display device 2808 that structures a part of the projector device 2601.

Figure 20B:
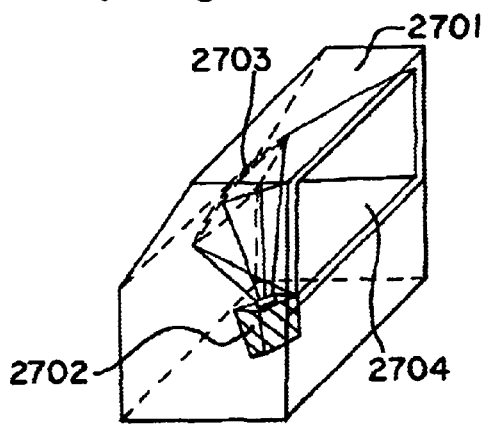

FIG. 20B is a rear type projector, which comprises: a main body 2701; a projector device 2702; a mirror 2703 and a screen 2704 etc. The present invention can be applied to the liquid crystal display device 2808 that comprises a part of the projector device 2702.

Figure 20C:
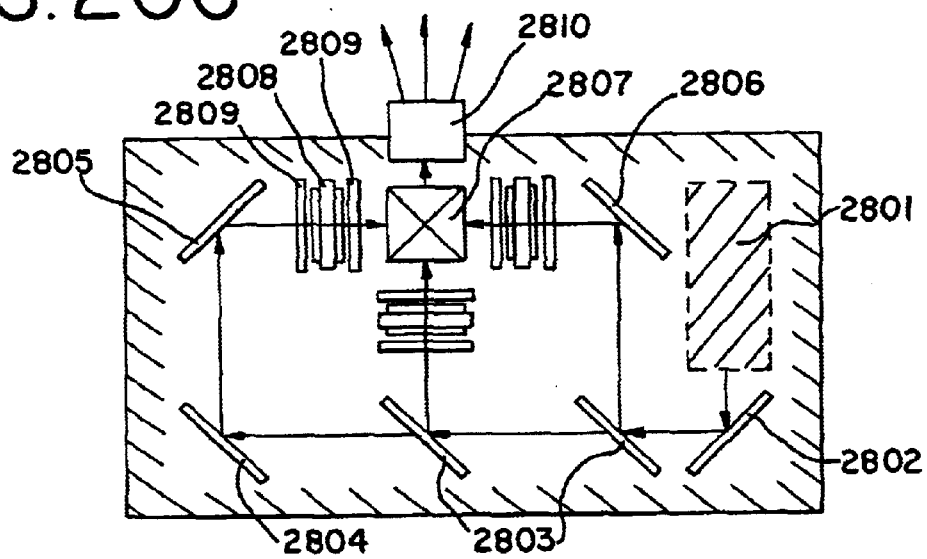

Note that FIG. 20C is a drawing showing one example of the structure of the projector devices 2601 and 2702 of FIGS. 20A and 20B. The projector devices 2601 and 2702 comprise: an optical light source system 2801; mirrors 2802 and 2804 to 2806; dichroic mirror 2803; a prism 2807; a liquid crystal display device 2808; phase differentiating plate 2809; and an optical projection system 2810. The optical projection system 2810 is composed of an optical system provided with a projection lens. The present embodiment shows an example of triple stage, but there are no special limits and a single stage is acceptable, for example. Further, the operator may set optical systems such as optical lenses, film having polarizing function, film to regulate the phase difference, IR films, etc., suitably within the optical path shown by an arrow in FIG. 20C.

Figure 20D:
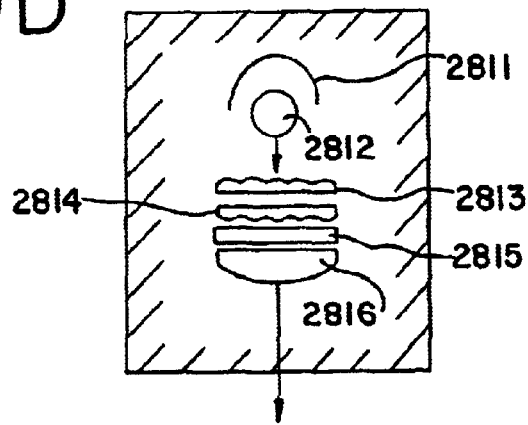

In addition, FIG. 20D shows one example of the structure of the optical light source system 2801 of FIG. 20C. In embodiment 9, the optical light source system 2801 comprises: a reflector 2811; a light source 2812; lens arrays 2813 and 2814; a polarizing conversion element 2815; and a condensing lens 2816. Note that the optical light source shown in FIG. 20D is merely an example and is not specifically limited to this structure. For example, the operator may suitably place optical lenses, film having polarizing function, film to regulate the phase difference, IR films, etc.

Figure 21A:
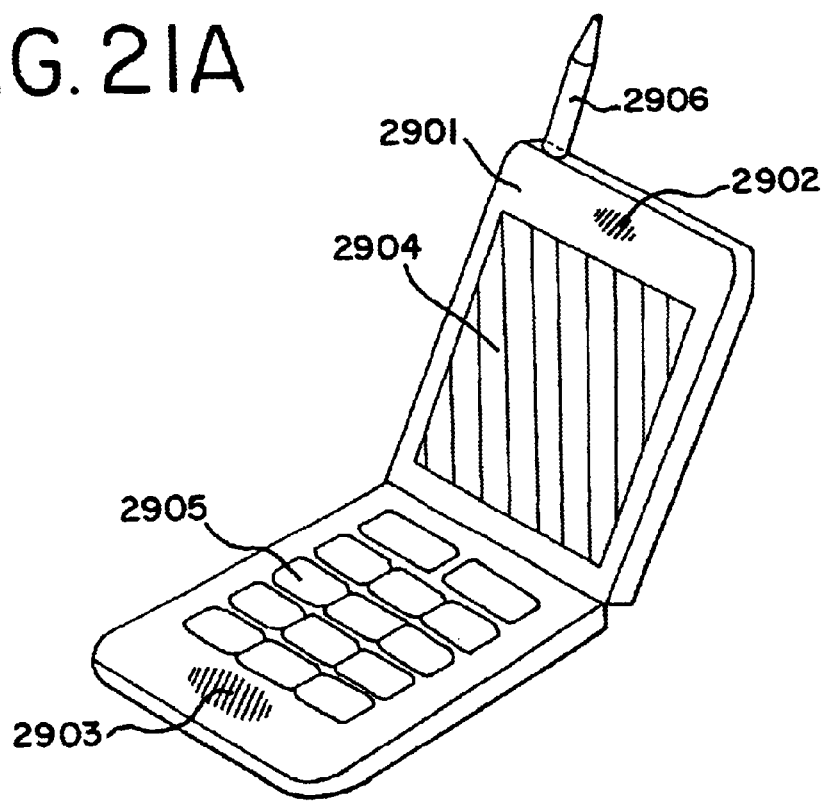
FIGS. 21A to 21C are diagrams showing examples of electronic equipment.

FIG. 21A is a portable telephone, which comprises: a main body 2901; a voice output section 2902; a voice input section 2903; a display section 2904; operation switches 2905; and an antenna 2906 etc. The present invention can be applied to the display section 2904.

Figure 21B:
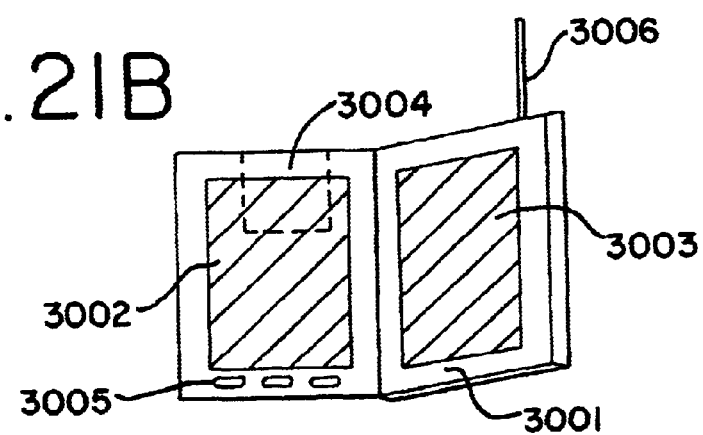

FIG. 21B is a portable book (electronic book), which comprises: a main body 3001; display sections 3002 and 3003; a recording medium 3004; operation switches 3005; and an antenna 3006, etc. The present invention can be applied to the display devices 3002 and 3003.

Figure 21C:
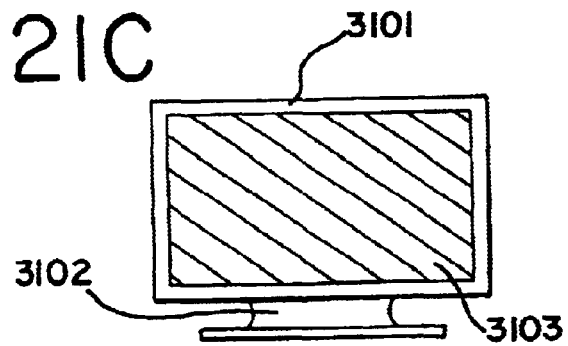

FIG. 21C is a display, which comprises: a main body 3101; a supporting section 3102; and a display section 3103 etc. The present invention can be applied to the display device 3103. The display of the present invention is specifically advantageous in large sized display, and it is advantageous in a display over diagonal 10 inch (specifically over 30 inch).

As shown above, the applicable range of the present invention is extremely wide, and it is possible to apply the present invention to electronic equipment in all fields. Further, an electronic device of the present invention can be realized by using structure of any combination of embodiments 1 to 7. By using the present invention, insulating films used in each circuit of an electro-optical device, typically an IPS method LCD, in particular by covering the surface of an electrode formed on a resin film by the anodic oxide film of the present invention, the amount of formation of the extra anodic oxide film can be reduced, and a liquid crystal display device having an electrode with superior adhesion, and having high reliability, can be manufactured.

Further, a storage capacitor having a large capacitance with a small surface area can be formed in a pixel portion of an electro-optical device, typically an IPS method LCD. Therefore, without lowering the aperture ratio even in an AM-LCD having a 1 inch or smaller diagonal, it becomes possible to ensure a sufficient storage capacitance. In addition, there is almost no formation of the extra anodic oxide film, and therefore the coverage of a pixel electrode formed thereon can be made well, and the yield can be improved.

What is claimed is:

1. A semiconductor device comprising:
    a pair of substrates;
    at least one thin film transistor formed over one of the pairs of the substrates;
    a leveling layer formed over the thin film transistor;
    a common electrode formed over the leveling layer;
    an insulating film formed on the common electrode;
    a pixel electrode formed on the insulating film, and connected to the thin film transistor via a contact hole in the leveling layer; and
    a capacitor comprising the common electrode, the insulating film and the pixel electrode, said capacitor is formed around the contact hole in the leveling layer,
    wherein an electric field parallel to the face of the substrates is applied between the pixel electrode and the common electrode.

2. A device according to claim 1, wherein the common electrode comprises a material which can be anodically oxidized.

3. A device according to claim 1, further comprising a liquid crystal layer located between the pair of substrates.

4. A device according to claim 1, wherein said semiconductor device comprises at least one electric equipment selected from the group consisting of a video camera, a digital camera, a projector, a goggle type display, a car navigation system, a personal computer, and a portable information terminal.

5. A device according to claim 1, said semiconductor device comprises an IPS display device.

6. A semiconductor device comprising:
a pair of substrates;
at least one thin film transistor formed over one of the pairs of the substrates;
a leveling layer formed over the thin film transistor;
a common electrode formed on the leveling layer;
an oxide film formed on the common electrode;
a pixel electrode formed on the oxide film and connected to the thin film transistor via a contact hole in the leveling layer; and
a capacitor comprising the common electrode, the oxide film, and the pixel electrode, the capacitor formed around the contact hole in the leveling layer,
wherein the pair of the substrates are surrounded by a sealing material, and spacers are formed in the region in which the sealing material is formed, and
wherein an electric field parallel to the face of the substrates is applied between the pixel electrode and the common electrode.

7. A device according to claim 6, wherein the oxide film is formed through an anodic oxidation process in which the applied voltage/voltage supply time ratio is equal to or greater than 11 V/min.

8. A device according to claim 6, wherein said semiconductor device comprises at least one electric equipment selected from the group consisting of a video camera, a digital camera, a projector, a goggle type display, a car navigation system, a personal computer, and a portable information terminal.

9. A device according to claim 6, further comprising a liquid crystal layer located between the pair of substrates.

10. A device according to claim 6, said semiconductor device comprises an IPS display device.

11. A semiconductor device having a pixel portion and at least one driving circuit, comprising:
a pair of substrates;
at least one thin film transistor formed over one of the pairs of the substrates;
a leveling layer formed over the thin film transistor;
a common electrode formed on the leveling layer;
an oxide film formed on the common electrode;
a pixel electrode formed on the oxide film and connected to the thin film transistor via a contact hole in the leveling layer;
a capacitor comprising the common electrode, the oxide film, and the pixel electrode, the capacitor formed around the contact hole in the leveling layer;
columnar spacers formed in a region between the pixel portion and the driver circuit and a region in which an element of the driver circuit does not exist,
wherein an electric field parallel to the face of the substrates is applied between the pixel electrode and the common electrode.

12. A device according to claim 11, wherein the insulating film comprises an oxide film formed through an anodic oxidation process in which the applied voltage/voltage supply time ratio is equal to or greater than 11 V/min.

13. A device according to claim 11, wherein said semiconductor device comprises at least one electric equipment selected from the group consisting of a video camera, a digital camera, a projector, a goggle type display, a car navigation system, a personal computer, and a portable information terminal.

14. A device according to claim 11, further comprising a liquid crystal layer located between the pair of substrates.

15. A device according to claim 11, said semiconductor device comprises an IPS display device.

16. A semiconductor device comprising:
at least a thin film transistor formed over a substrate;
a leveling layer formed over the thin film transistor;
a common electrode formed on the leveling layer;
an oxide film formed on at least a portion of the common electrode;
a pixel electrode formed on the oxide film and electrically connected to the thin film transistor via a contact hole in the leveling layer;
a capacitor comprising the common electrode, the oxide film, and the pixel electrode, the capacitor formed around the contact hole in the leveling layer; and
a columnar spacer formed over the contact hole,
wherein an electric field parallel to the face of the substrate is applied between the pixel electrode and the common electrode.

17. A device according to claim 16, wherein the oxide film is formed through an anodic oxidation process in which the applied voltage/voltage supply time ratio is equal to or greater than 11 V/min.

18. A device according to claim 16, wherein said semiconductor device comprises at least one electric equipment selected from the group consisting of a video camera, a digital camera, a projector, a goggle type display, a car navigation system, a personal computer, and a portable information terminal.

19. A device according to claim 16, further comprising a liquid crystal layer located over the pixel electrode.

20. A device according to claim 16, said semiconductor device comprises an IPS display device.

21. A semiconductor device comprising:
a semiconductor film formed over a substrate, said semiconductor film having at least a channel forming region, a source region, and a drain region;
a gate electrode adjacent to the semiconductor film with a gate insulating film interposed therebetween;
source and drain electrodes connected to the source and drain regions, respectively;
a leveling layer formed over the source and drain electrodes;
a common electrode formed over the leveling layer;
an oxide film formed on the common electrode;
a pixel electrode formed on the oxide film and electrically connected to the drain electrode via a contact hole in the leveling layer;
a capacitor comprising the common electrode, the oxide film, and the pixel electrode, the capacitor formed around the contact hole in the leveling layer; and
a columnar spacer formed over the contact hole,
wherein said semiconductor device comprises an In-Plane Switching (IPS) display device.

22. A device according to claim 21, wherein the leveling layer comprises an organic resin material.

23. A device according to claim 21, wherein the oxide film comprises an oxide film of the common electrode.

24. A device according to claim 21, further comprising a liquid crystal layer located over the pixel electrode.

25. A device according to claim 21, wherein said semiconductor device comprises at least one electric equipment selected from the group consisting of a video camera, a digital camera, a projector, a goggle type display, a car navigation system, a personal computer, and a portable information terminal.

26. A semiconductor device comprising:
a semiconductor film formed over a substrate, said semiconductor film having at least a channel forming region, a source region, and a drain region;
a gate electrode adjacent to the semiconductor film with a gate insulating film interposed therebetween;
source and drain electrodes connected to the source and drain regions, respectively;
a leveling layer formed over the source and drain electrodes;
a buffer layer formed over the leveling layer;
a common electrode formed over the leveling layer with the buffer layer interposed therebetween;
an oxide film covering the common electrode;
a pixel electrode formed on the oxide film and electrically connected to the drain electrode via a contact hole in the leveling layer; and
a capacitor comprising the common electrode, the oxide film, and the pixel electrode, the capacitor formed around the contact hole in the leveling layer,
wherein said semiconductor device comprises an In-Plane Switching (IPS) display device.

27. A device according to claim 26, wherein the leveling layer comprises an organic resin material.

28. A device according to claim 26, wherein said oxide film comprises an oxide film of the common electrode.

29. A device according to claim 26, further comprising a liquid crystal layer located over the pixel electrode.

30. A device according to claim 26, wherein said semiconductor device comprises at least one electric equipment selected from the group consisting of a video camera, a digital camera, a projector, a goggle type display, a car navigation system, a personal computer, and a portable information terminal.

31. A semiconductor device comprising:
a semiconductor film formed over a substrate, said semiconductor film having at least a channel forming region, a source region, and a drain region;
a gate electrode adjacent to the semiconductor film with a gate insulating film interposed therebetween;
source and drain electrodes connected to the source and drain regions, respectively;
a leveling layer formed over the source and drain electrodes;
a buffer layer formed over the leveling layer;
a common electrode formed over the leveling layer with the buffer layer interposed therebetween;
an oxide film covering the common electrode;
a pixel electrode formed on the oxide film and electrically connected to the drain electrode via a contact hole in the leveling layer; and
a capacitor comprising the common electrode, the oxide film, and the pixel electrode, the capacitor formed around the contact hole in the leveling layer,
wherein said buffer layer comprises an insulating film formed by sputtering.

32. A device according to claim 31, wherein the leveling layer comprises an organic resin material.

33. A device according to claim 31, wherein said insulating film comprises an oxide film of the common electrode.

34. A device according to claim 31, further comprising a liquid crystal layer located over the pixel electrode.

35. A device according to claim 31, said semiconductor device comprises an IPS display device.

36. A device according to claim 31, wherein said semiconductor device comprises at least one electric equipment selected from the group consisting of a video camera, a digital camera, a projector, a goggle type display, a car navigation system, a personal computer, and a portable information terminal.

\* \* \* \* \*